(12) United States Patent
Chu et al.

(10) Patent No.: US 11,848,368 B2
(45) Date of Patent: Dec. 19, 2023

(54) TRANSISTORS WITH DIFFERENT THRESHOLD VOLTAGES

(71) Applicant: Taiwan Semiconductor Manufacturing Co., Ltd., Hsinchu (TW)

(72) Inventors: Lung-Kun Chu, New Taipei (TW); Mao-Lin Huang, Hsinchu (TW); Chung-Wei Hsu, Hsinchu County (TW); Jia-Ni Yu, New Taipei (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 115 days.

(21) Appl. No.: 17/504,206

(22) Filed: Oct. 18, 2021

(65) Prior Publication Data

US 2022/0037499 A1 Feb. 3, 2022

Related U.S. Application Data

(62) Division of application No. 16/802,275, filed on Feb. 26, 2020, now Pat. No. 11,152,477.

(51) Int. Cl.
*H01L 29/423* (2006.01)
*H01L 21/28* (2006.01)
(Continued)

(52) U.S. Cl.
CPC .. *H01L 29/42392* (2013.01); *H01L 21/28061* (2013.01); *H01L 21/28088* (2013.01);
(Continued)

(58) Field of Classification Search
CPC ............. H01L 29/42392; H01L 21/82345
See application file for complete search history.

(56) References Cited

U.S. PATENT DOCUMENTS 9,818,872 B2  11/2017  Ching et al.
9,887,269 B2   2/2018  Ching et al.
(Continued)

FOREIGN PATENT DOCUMENTS

KR  20150033496 A   4/2015
KR  20190038282 A   4/2019
TW    201941426 A  10/2019

*Primary Examiner* — Farun Lu
(74) *Attorney, Agent, or Firm* — HAYNES AND BOONE, LLP

(57) ABSTRACT

A semiconductor having a first gate-all-around (GAA) transistor, a second GAA transistor, and a third GAA transistor is provided. The first (GAA) transistor includes a first plurality of channel members, a gate dielectric layer over the first plurality of channel members, a first work function layer over the gate dielectric layer, and a glue layer over the first work function layer. The second GAA transistor include a second plurality of channel members, the gate dielectric layer over the second plurality of channel members, and a second work function layer over the gate dielectric layer, the first work function layer over and in contact with the second work function layer, and the glue layer over the first work function layer. The third GAA transistor includes a third plurality of channel members, the gate dielectric layer over the third plurality of channel members, and the glue layer over the gate dielectric layer.

20 Claims, 25 Drawing Sheets

(51) Int. Cl.
  *H01L 21/3205*  (2006.01)
  *H01L 21/8234*  (2006.01)
  *H01L 27/088*   (2006.01)
  *H01L 29/49*    (2006.01)
  *H01L 29/66*    (2006.01)
  *H01L 29/78*    (2006.01)
  *H01L 29/06*    (2006.01)

(52) U.S. Cl.
  CPC .. *H01L 21/32051* (2013.01); *H01L 21/82345* (2013.01); *H01L 27/088* (2013.01); *H01L 27/0886* (2013.01); *H01L 29/4958* (2013.01); *H01L 29/4966* (2013.01); *H01L 29/66545* (2013.01); *H01L 29/66795* (2013.01); *H01L 29/785* (2013.01); *H01L 29/0665* (2013.01); *H01L 2029/7858* (2013.01)

(56) References Cited

U.S. PATENT DOCUMENTS

| | | |
|---|---|---|
| 9,899,398 B1 | 2/2018 | Colinge et al. |
| 9,922,984 B1* | 3/2018 | Bao .................... H01L 29/7842 |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2016/0225868 A1 | 8/2016 | Kim et al. |
| 2018/0175036 A1 | 6/2018 | Ching et al. |
| 2019/0081148 A1* | 3/2019 | Chung ................ H01L 29/0673 |
| 2019/0198498 A1 | 6/2019 | Park et al. |

* cited by examiner

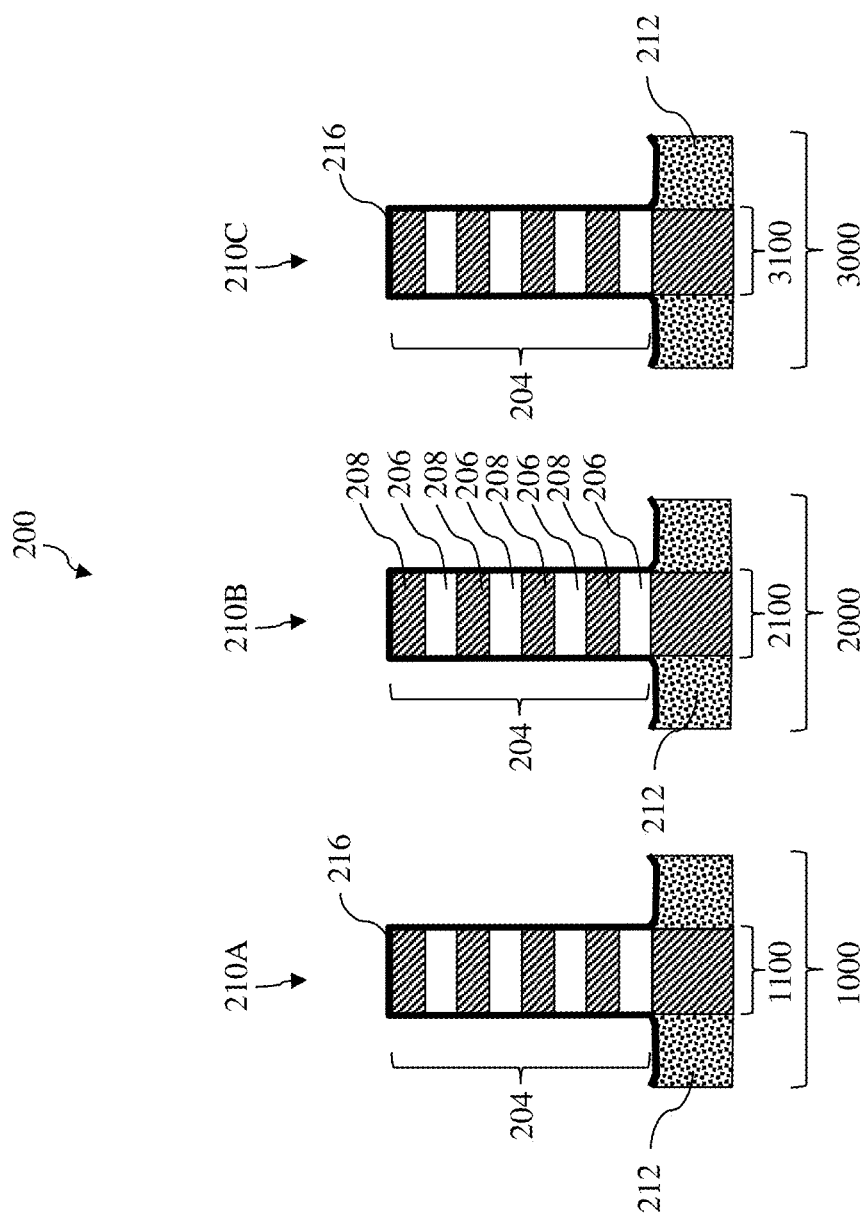

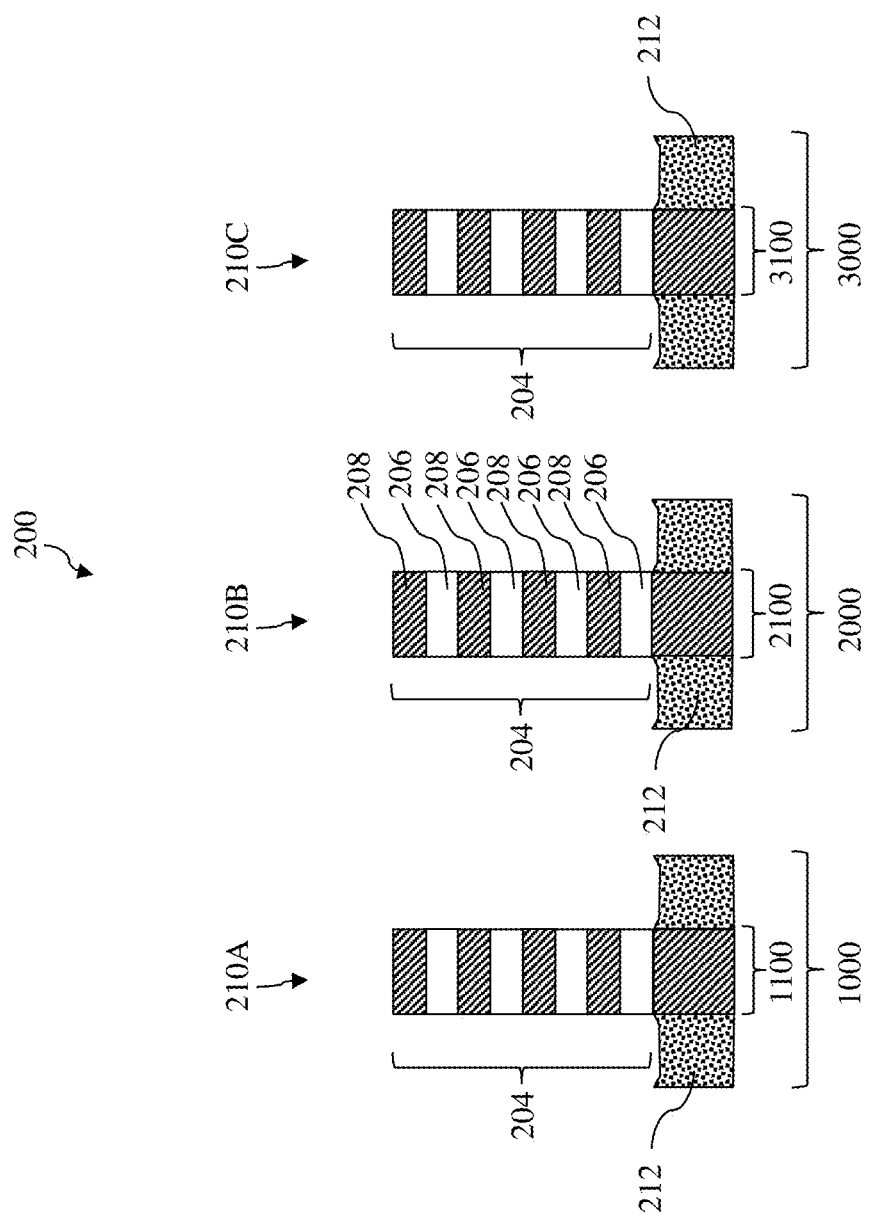

TRANSISTORS WITH DIFFERENT THRESHOLD VOLTAGES

PRIORITY DATA

This application is a divisional application of U.S. patent application Ser. No. 16/802,275, filed Feb. 26, 2020, the entirety of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

When GAA transistors with different threshold voltages are desired, one or more layers may be blanketly deposited over all channel regions and selectively removed from a subset of the channel regions. Sometimes it may be challenging to remove materials deposited between nanostructures in the channel region. Failure to remove or completely remove such materials may result in failed device or decreased performance. Therefore, although existing GAA transistors and processes forming them are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 3-23 illustrate fragmentary cross-sectional views of the first area and the second area of the workpiece at various stages of fabrication in accordance with the method in FIG. 1.

DETAILED DESCRIPTION

Figure 1:
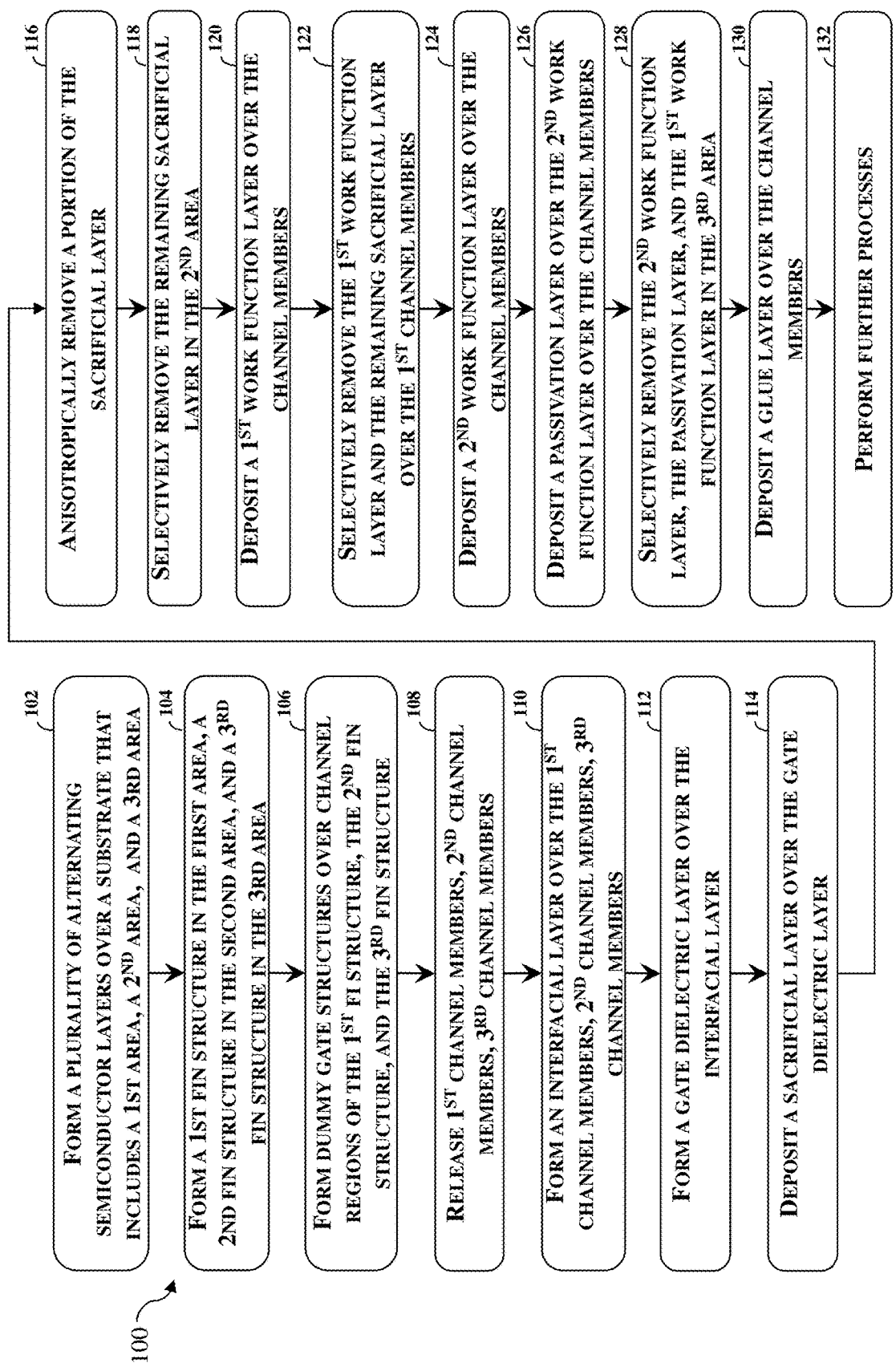
FIG. 1 is a flowchart illustrating a method of forming a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to GAA transistors, and more particularly, to GAA transistors of different threshold voltages that are in a semiconductor device. A semiconductor device according to embodiments of the present disclosure includes a first-type GAA transistor in a first area, and a second-type GAA transistor in a second area, and a third-type GAA transistor in a third area. The first-type GAA transistor includes first vertically stacked channel members, the second-type GAA transistor includes second vertically stacked channel members, and the third-type GAA transistor includes third vertically stacked channel members. The first-type GAA transistor includes an interfacial layer over the first vertically stacked channel members, a gate dielectric layer over the interfacial layer, an n-type work function layer over the gate dielectric layer, a passivation layer over the n-type work function layer, a glue layer over the passivation layer, and a metal fill layer over the glue layer. The second-type GAA transistor includes an interfacial layer over the second vertically stacked channel members, the gate dielectric layer over the interfacial layer, a p-type work function layer over the gate dielectric layer, an n-type work function layer over the p-type work function layer, the passivation layer over the n-type work function layer, the glue layer over the passivation layer, and the metal fill layer over the glue layer. The third-type GAA transistor includes an interfacial layer over the third vertically stacked channel members, the gate dielectric layer over the interfacial layer, the glue layer over the gate dielectric layer, and the metal fill layer over the glue layer. According to embodiments of the present disclosure, the process for forming the semiconductor device includes formation of a sacrificial layer between channel members to prevent hard-to-remove work function layers from being deposited between channel members. With little or no hard-to-remove work function layers disposed between channel members, removing materials between channel members is made easy and subsequently deposited layers may be deposited around channel members.

FIG. 1 illustrates a flow chart of a method 100 for fabricating a semiconductor device according to various aspects of the present disclosure. FIG. 1 will be described below in conjunction with FIGS. 2A, 2B, 2C, and 3-23, which are fragmentary cross-sectional views of a workpiece at various stages of fabrication according to method 100 in FIG. 1 before the semiconductor device is fabricated on the workpiece. Throughout the present disclosure, for the ease of reference, the workpiece and the semiconductor device may be referred to interchangeably because the workpiece is to become the semiconductor device upon the conclusion of its fabrication processes and may share the same reference numeral. Additional steps can be provided before, during, and after method 100, and some of the steps described can be moved, replaced, or eliminated for additional embodiments of method 100. Additional features can be added in the semiconductor device depicted in FIGS. 2A, 2B, 2C, and 3-23 and some of the features described below can be replaced, modified, or eliminated in other embodiments of the semiconductor device.

Figure 2A:
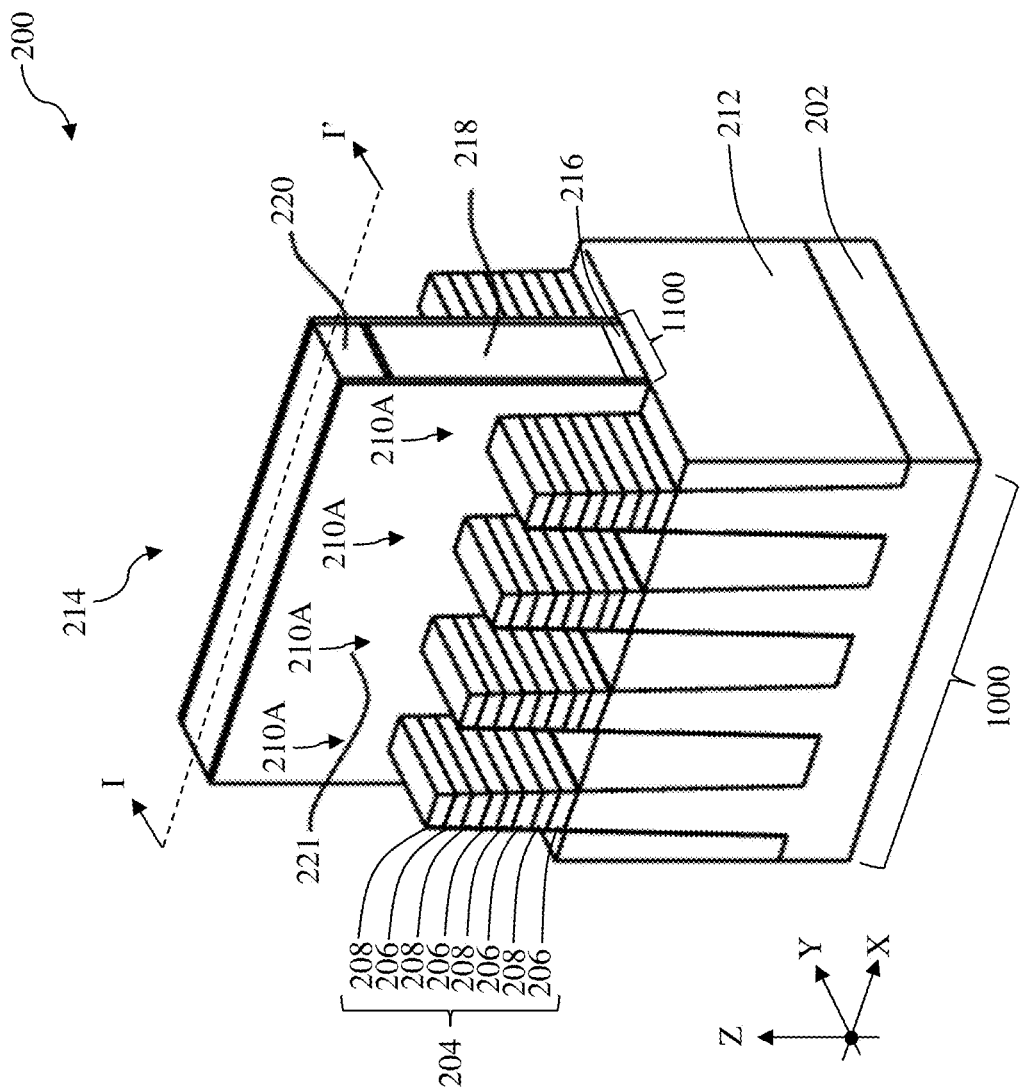
FIG. 2A is a diagrammatic perspective view of a first area of a workpiece, according to various aspects of the present disclosure.
Figure 2B:
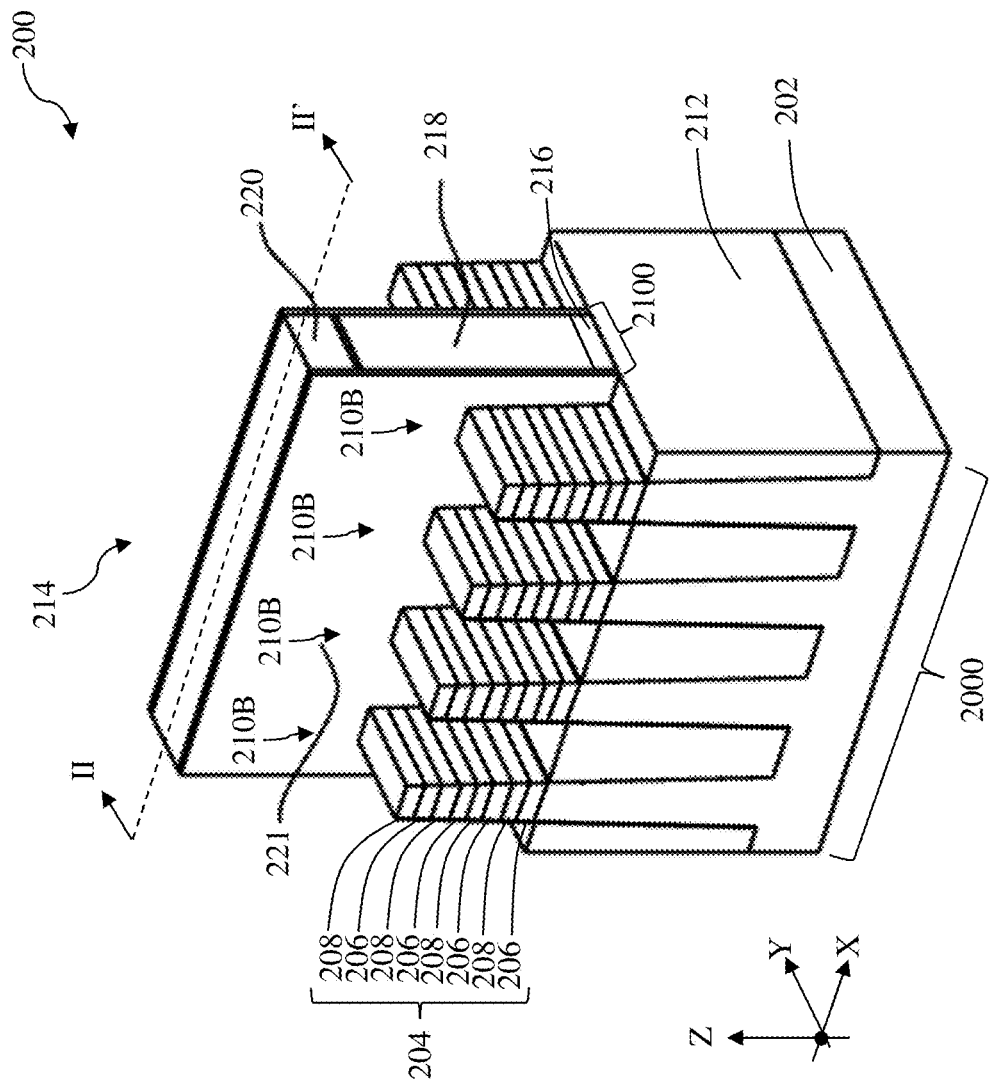
FIG. 2B is a diagrammatic perspective view of a second area of a workpiece, according to various aspects of the present disclosure.
Figure 2C:
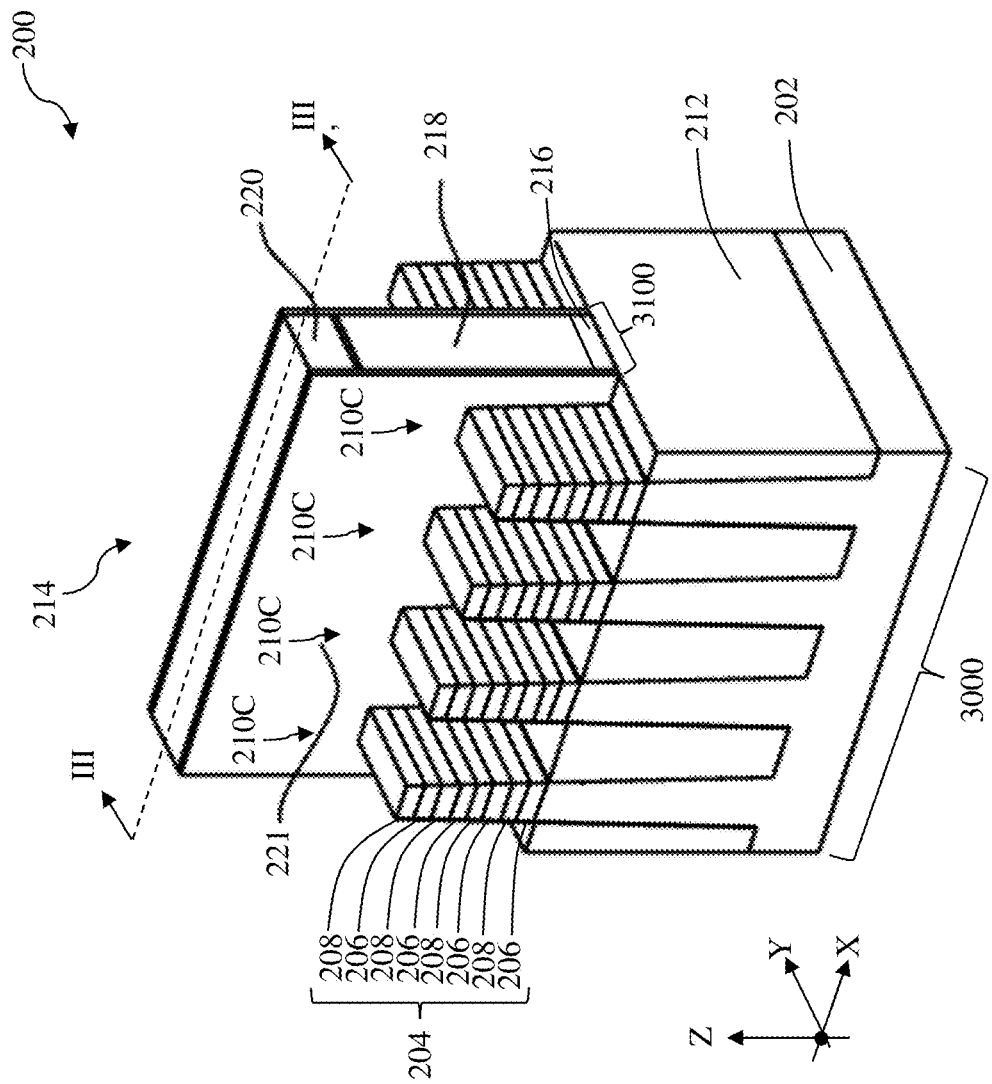
FIG. 2C is a diagrammatic perspective view of a third area of a workpiece, according to various aspects of the present disclosure.

Referring now to FIGS. 1, 2A, 2B, and 2C, the method 100 includes a block 102 where a plurality of alternating semiconductor layers 204 over a first area 1000, a second area 2000, and a third area 300 on a substrate 202 of a workpiece 200. The first area 1000 of the workpiece 200 is illustrated in FIG. 2A, the second area 2000 of the workpiece 200 is illustrated in FIG. 2B, and the third area 3000 of the workpiece 200 is illustrated in FIG. 2C. In some embodiments, the substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 202 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices are formed over n-type wells and n-type GAA devices are formed over p-type wells.

The first area 1000, the second area 2000, and the third area 3000 are device areas for transistors having different threshold voltages. In some embodiments, the first area 1000 may be an n-type device area featured by a first threshold voltage, the third area 3000 may be a p-type device area featured by a third threshold voltage, and the second area 2000 may be a mid-level device area featured by a second threshold voltage between the first threshold voltage and the third threshold voltage. The first threshold voltage, the second threshold voltage, and the third threshold voltage are different from one another. By way of example, the first threshold voltage may be between about 4.3 eV and about 4.5 eV, the second threshold voltage may be between about 4.5 eV and about 4.7 eV, and the third threshold voltage may be between about 4.7 eV and about 4.9 eV. Depending on the design parameters, the mid-level devices in the second area 2000 may function as n-type devices or as p-type devices to reduce leakage current.

In the embodiments represented in FIGS. 2A, 2B and 2C, the plurality of alternating semiconductor layers 204 includes a plurality of first semiconductor layers 208 interleaved by a plurality of the second semiconductor layers 206. That is, two neighboring first semiconductor layers 208 sandwich one second semiconductor layer 206. The plurality of first semiconductor layers 208 is formed of a first semiconductor material and the plurality of second semiconductor layers 206 is formed of a second semiconductor material that is different from the first semiconductor material. In some embodiments, the first semiconductor material is or consists essentially of silicon (Si) and the second semiconductor material is or consists essentially of silicon germanium (SiGe). In some other embodiments, the first semiconductor material is or consists essentially of silicon (Si) and the second semiconductor material is or consists essentially of germanium (Ge). In some alternative embodiments, the first semiconductor material includes silicon germanium (SiGe) having a first germanium content and the second semiconductor material includes silicon germanium (SiGe) having a second germanium content higher than the first germanium content. The plurality of alternating semiconductor layers 204 may be formed by depositing or epitaxially growing the plurality of first semiconductor layers 208 and the plurality of second semiconductor layers 206 alternatingly. In some implementations, after the plurality of alternating semiconductor layers 204 is patterned into fin structures (fin-shaped active regions), a portion of the plurality of the second semiconductor layers 206 in channel regions may be selectively removed to release channel members formed from the plurality of the first semiconductor layers 208. In this regard, the second semiconductor layers 206 function as sacrificial semiconductor layers and may be referred to as so.

Referring still to FIGS. 1, 2A, 2B, and 2C, the method 100 includes a block 104 where a first fin structure 210A is formed in the first area 1000, a second fin structure 210B is formed in the second area 2000, a third fin structure 210C is formed in the third area 3000. As shown in FIG. 2A, the plurality of alternating semiconductor layers 204 may be patterned to form the first fin structure 210A in the first area 1000. As shown in FIG. 2B, the plurality of alternating semiconductor layers 204 may be patterned to form the second fin structure 210B in the second area 2000. As shown in FIG. 2C, the plurality of alternating semiconductor layers 204 may be patterned to form the third fin structure 210C in the third area 3000. At block 104, the first fin structures 210A, the second fin structures 210B, and the third fin structures 210C may be patterned by using suitable processes such as photolithography and etching processes. In some embodiments, the fin structures are etched from the plurality of alternating semiconductor layers 204 using dry etch or plasma etch processes. In some other embodiments, the fin structures can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. In some implementations, dielectric isolation features 212 are formed among the first fin structures 210A, the second fin structures 210B, and the third fin structures 210C. The dielectric isolation features 212 may also be referred to as shallow trench isolation (STI) features 212.

Referring still to FIGS. 1, 2A, 2B, and 2C, the method 100 includes a block 106 where a dummy gate structure 214 is formed over a first channel region 1100 of the first fin structure 210A, a second channel region 2100 of the second fin structure 210B, and a third channel region 3100 of the third fin structure 210C. As illustrated in FIGS. 2A, 2B and 2C, the dummy gate structure 214 may include a dummy gate dielectric layer 216, a dummy gate electrode 218, a gate top hard mask 220, and a gate spacer 221. In some embodiments, the dummy gate electrode 218 may be formed of polysilicon and the dummy gate dielectric layer 216 may be formed of silicon oxide, or silicon oxynitride. The gate top hard mask 220 may be formed of silicon oxide or silicon nitride. In some implementations, the gate top hard mask 220 may include multiple layers. For example, the gate top hard mask 220 may include a silicon oxide layer adjacent the dummy gate electrode 218 and a silicon nitride layer over the silicon oxide layer. The gate spacer 221 extend along sidewalls of the dummy gate electrode 218 and define the first channel region 1100 and the second channel region 2100. In some embodiments, the gate spacer 221 may be formed of silicon oxide, silicon oxynitride, silicon nitride, silicon oxycarbonitride, a low-k dielectric material with a dielectric constant lower than that of silicon dioxide (i.e., about 3.9), or a combination thereof.

For clarity of description and illustration, each of FIGS. 3-23 includes a fragmentary cross-sectional view of a first fin structure 210A along the section I-I' shown in FIG. 2A, a fragmentary cross-sectional view of a second fin structure 210B along the section II-II' shown in FIG. 2B, and a fragmentary cross-sectional view of a third fin structure 21CA along the section III-III' shown in FIG. 2C. As shown in FIG. 2A, the section I-I' extends along the dummy gate structure 214 and passes the first channel region 1100. As shown in FIG. 2B, the section II-II' extends along the dummy gate structure 214 and passes the second channel region 2100. As shown in FIG. 2C, the section III-III' extends along the dummy gate structure 214 and passes the third channel region 3100.

Figure 5:
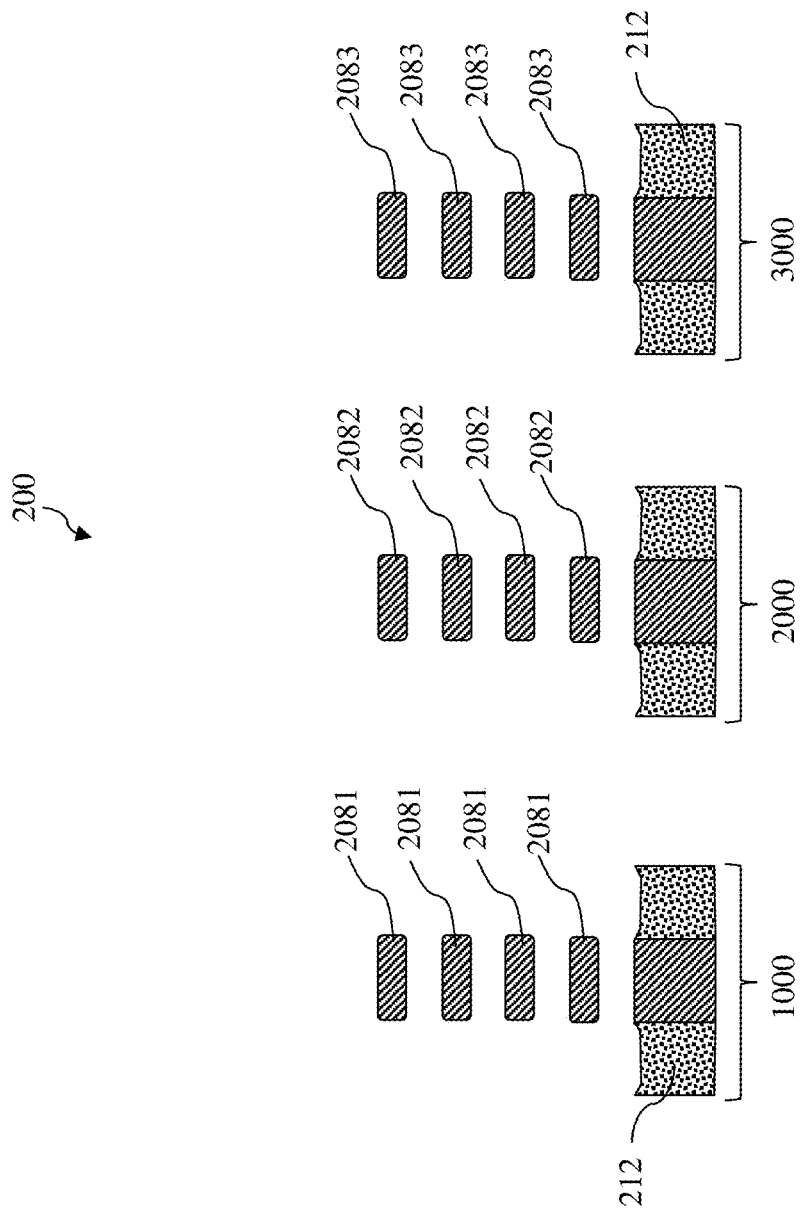

Referring to FIGS. 1 and 3-5, the method 100 includes a block 108 where first channel members 2081 in the first channel region 1100 are released, second channel members 2082 in the second channel region 2100 are released, and third channel members 2083 in the third channel region 3100 are released. In some embodiments, after the dummy gate structure 214 is formed at block 106, the dummy gate structure 214 is used as an etch mask to recess the first fin structure 210A, the second fin structure 210B, and the third fin structure 210C to form source/drain trenches to expose sidewalls of the plurality of first semiconductor layers 208 and the plurality of the second semiconductor layers 206 in the first channel region 1100, the second channel region 2100, and the third channel region 3100. In some embodiments, the plurality of the second semiconductor layers 206 in the first channel region 1100, the second channel region 2100, and the third channel region 3100 may be selectively and partially etched to form inner spacer recesses between two of the plurality of first semiconductor layers 208. An inner spacer feature is then formed within the inner spacer recesses. Then epitaxial source/drain features may be formed in the source/drain trenches. After the epitaxial source/drain features are formed, an interlayer dielectric (ILD) layer may be deposited over the workpiece 200. A planarization process, such as a chemical mechanical polishing (CMP) process, may be performed to planarize the workpiece 200 until the dummy gate electrode 218 is exposed. The exposed dummy gate electrode 218 may then be selectively removed using a suitable dry etch or wet etch process. FIG. 3 illustrates the plurality of alternating semiconductor layers 204 in the first channel region 1100, the second channel region 2100, and the third channel region 3100 after the dummy gate electrode 218 is removed. In some embodiments, the dummy gate dielectric layer 216 may be removed using a suitable etch process that is different from the one used to remove the dummy gate electrode 218. FIG. 4 illustrates the plurality of alternating semiconductor layers 204 in the first channel region 1100, the second channel region 2100 and the third channel region 3100 after the dummy gate dielectric layer 216 is removed. After the dummy gate dielectric layer 216 is removed, the plurality of second semiconductor layers 206 may be selectively removed. In some implementations, the plurality of second semiconductor layers 206 are formed of silicon germanium and the selective removal process includes oxidizing the plurality of second semiconductor layers 206 using a suitable oxidizer, such as ozone. Thereafter, the oxidized second semiconductor layers 206 may be selectively removed. At this point, as shown in FIG. 5, the first channel members 2081 are formed in the first area 1000 and the second channel members 2082 are formed in the second area 2000, and third channel members 2083 are formed in the third area 3000.

Figure 6:
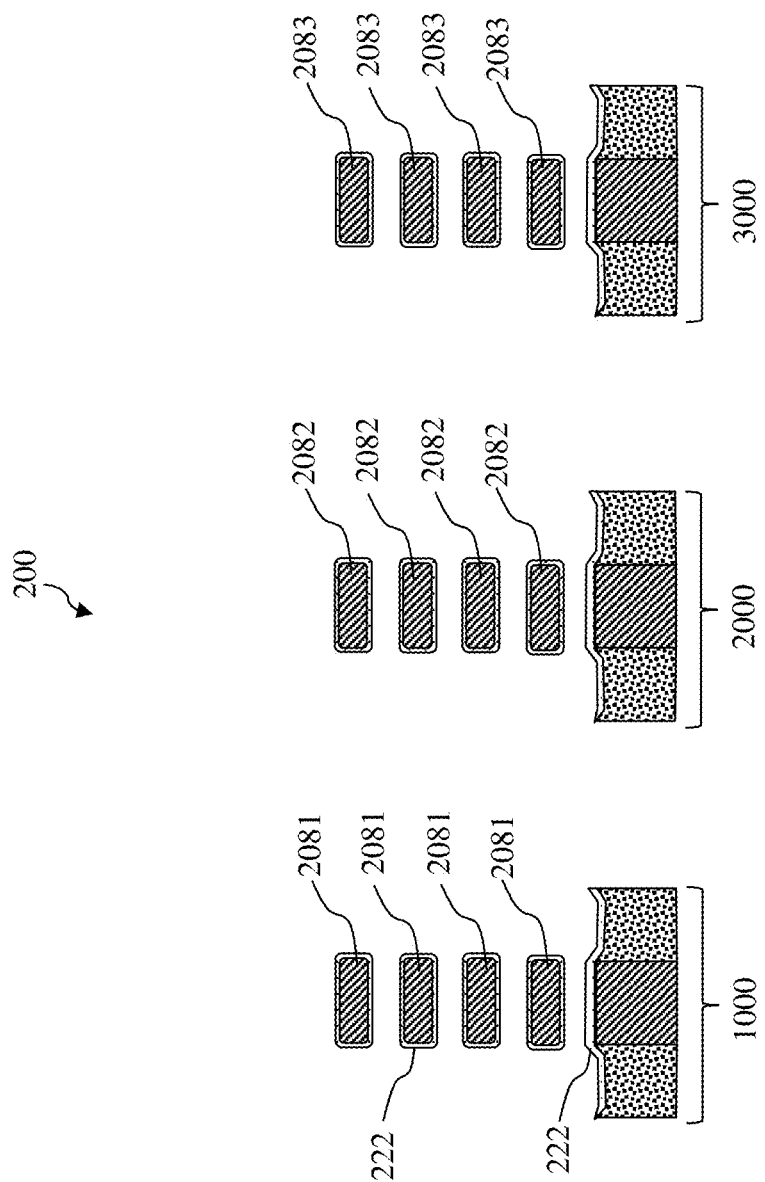

Referring to FIGS. 1 and 6, the method 100 includes a block 110 where an interfacial layer 222 is formed over the first channel members 2081 in the first area 1000, second channel members 2082 in the second area 2000, and the third channel members 2083 in the third area 3000. In some embodiments, the interfacial layer 222 may include silicon oxide or silicon oxynitride, or other suitable material. In some embodiments, the interfacial layer 222 may be deposited using a suitable method, such as atomic layer deposition (ALD), chemical vapor deposition (CVD), ozone oxidation, thermal oxidation, or other suitable method. The interfacial layer 222 serves the function to control and reduce gate leakage current and improve interfacial adhesion between the gate dielectric layer 228 (shown in FIG. 7) and the channel members (including the first channel members 2081, second channel members 2082, and the third channel members 2083).

Figure 7:
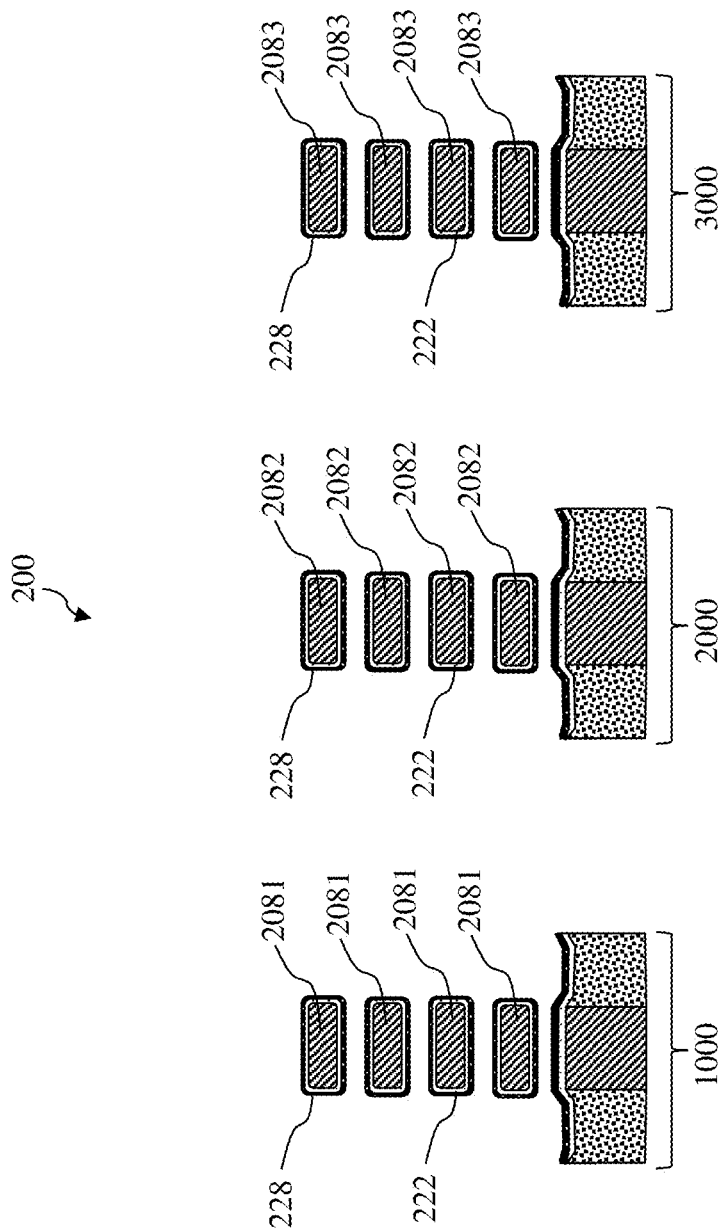

Referring to FIGS. 1 and 7, the method 100 includes a block 112 where a gate dielectric layer 228 is deposited over the interfacial layer 222 in the first area 1000, the second area 2000, and the third area 3000. In some embodiments, the gate dielectric layer 228 is high-k dielectric layer as its dielectric constant is greater than that of silicon dioxide (~3.9). In some implementations, the gate dielectric layer 228 may include doped or undoped hafnium oxide ($HfO_2$), doped or undoped zirconium oxide ($ZrO_2$), doped or undoped titanium oxide ($TiO_2$), or doped or undoped aluminum oxide ($Al_2O_3$). For example, the gate dielectric layer 228 may include hafnium silicon oxide (HfSiO), hafnium silicon oxynitride (HfSiON), or hafnium aluminum oxide (HfAlO), hafnium tantalum oxide (HfTaO), Hafnium zirconium oxide (HfZrO), zirconium silicon oxide ($ZrSiO_2$), hafnium titanium oxide (HfTiO), or a combination thereof. Upon conclusion of operations at block 112, each of the first channel members 2081, the second channel members 2082, and the third channel members 2083 is wrapped around by the interfacial layer 222 and the gate dielectric layer 228.

Figure 8:
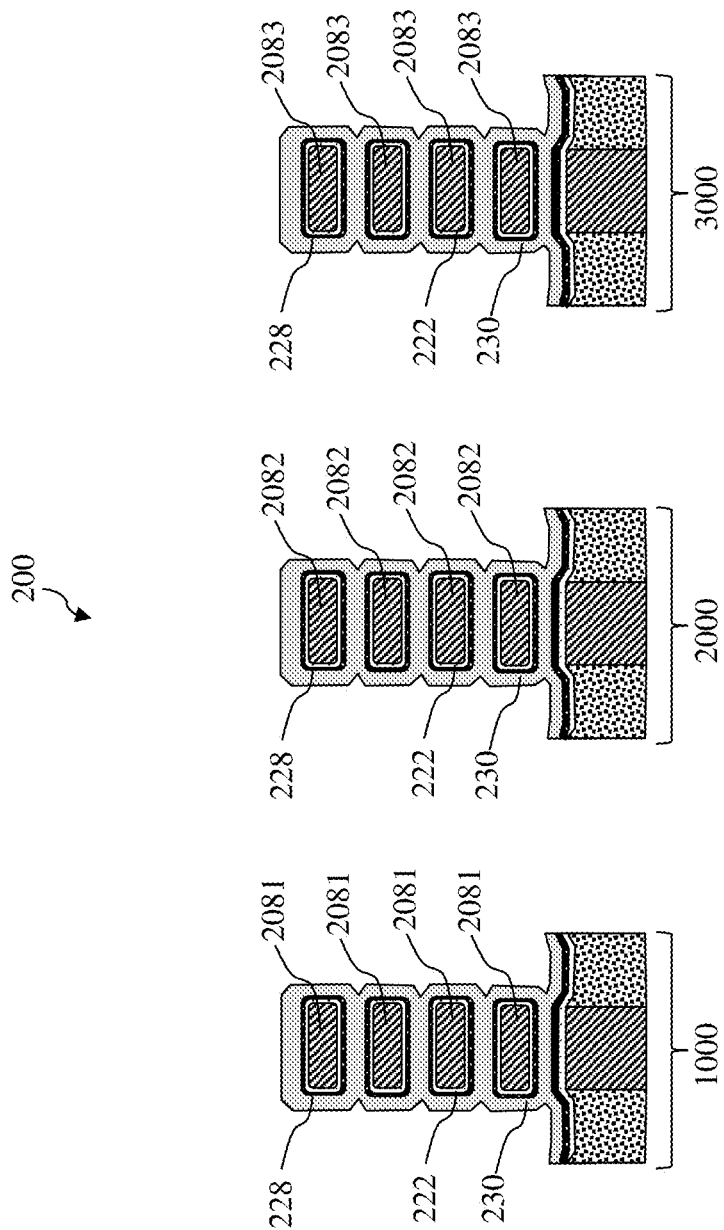

Referring to FIGS. 1 and 8, the method 100 includes a block 114 where a sacrificial layer 230 is deposited over the gate dielectric layer 228. According to the present disclosure, the sacrificial layer 230 is formed of a material that may be selectively removed without substantially damaging the gate dielectric layer. In some embodiments, the sacrificial layer 230 is formed of a dielectric material (such as silicon oxide, silicon nitride, aluminum oxide, titanium oxide, zirconium oxide), a semiconductor material (such as silicon or germanium or SiGe), a low-density metal nitride (such as titanium nitride), or other suitable materials. In some examples, the sacrificial layer 230 may be formed of silicon oxide or silicon nitride. The sacrificial layer 230 may be deposited using atomic layer deposition (ALD) or other suitable method.

Figure 9:
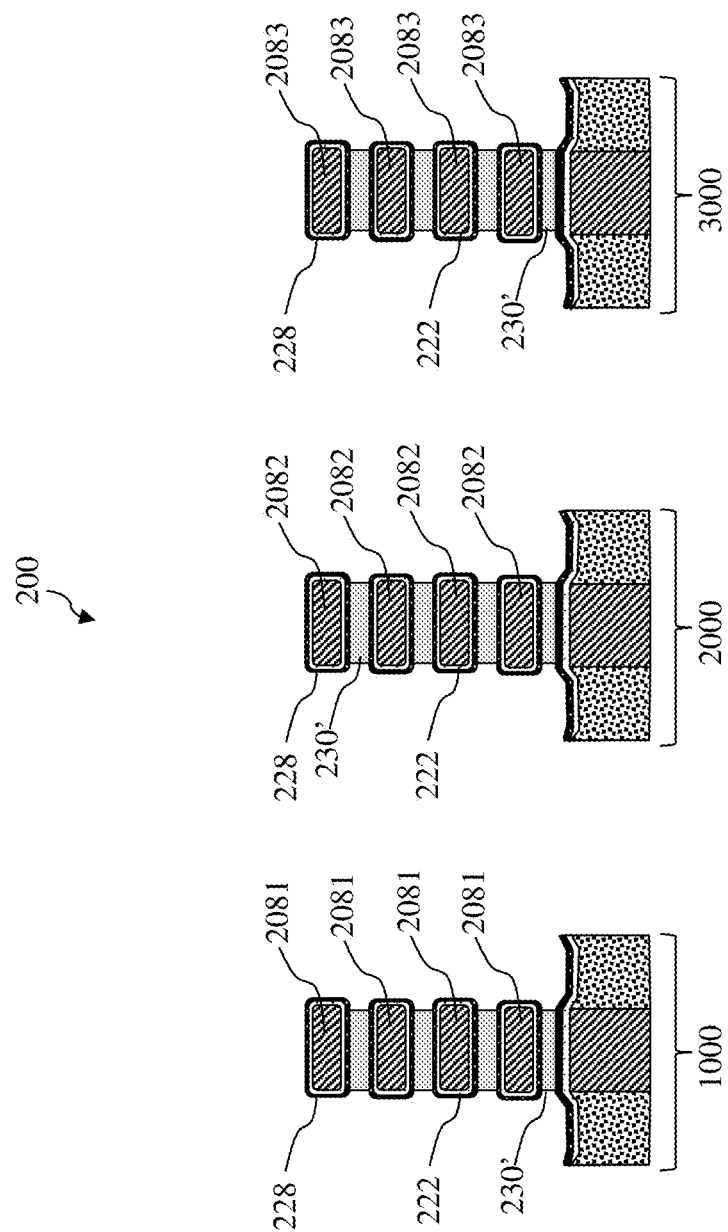
Figure 10:
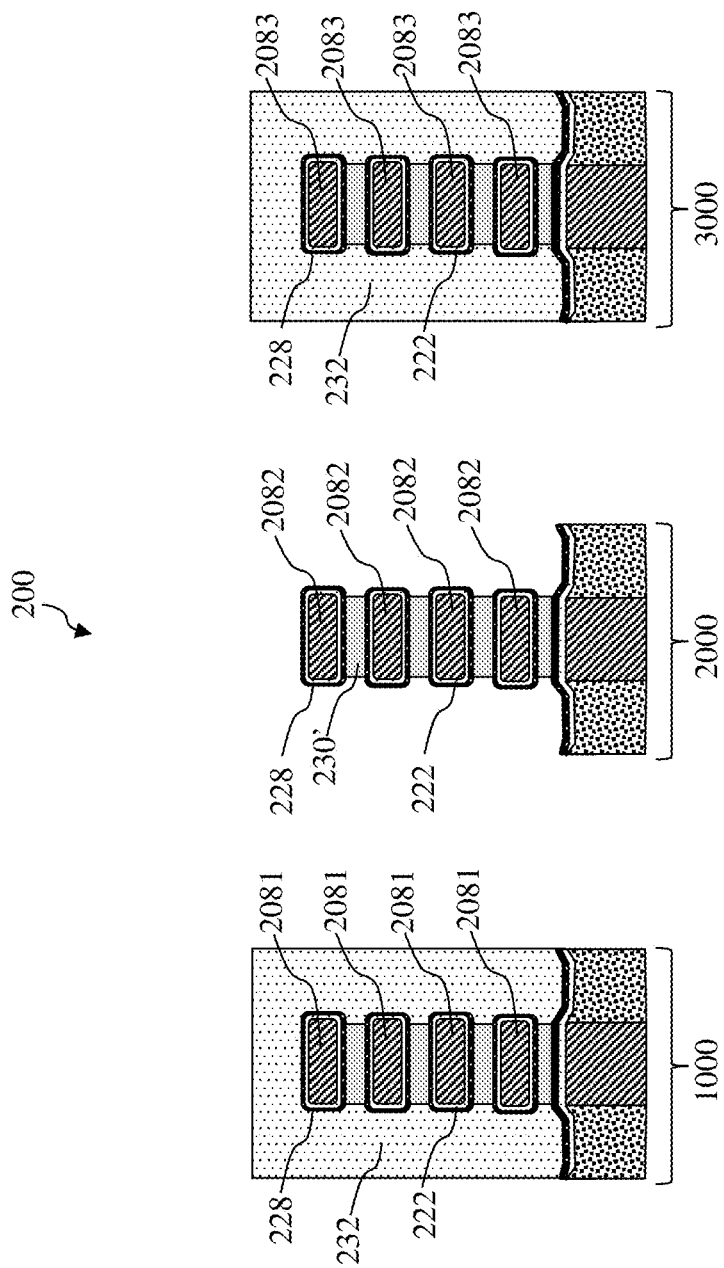

Referring to FIGS. 1 and 9, the method 100 includes a block 116 where a portion of the sacrificial layer 230 is removed. In some embodiments, at block 116, each of the first channel members 2081, second channel members 2082, and the third channel members 2083 serves as an etch mask or etch shield when the sacrificial layer 230 is etched. The removal of the sacrificial layer 230 at block 116 includes a dry etch process or a wet etch that is selected based on the material forming the sacrificial layer 230. In some implementations represented in FIG. 9, a portion of the sacrificial layer 230 that is disposed between adjacent channel members remains after conclusion of operations at block 116. This remaining portion of the sacrificial layer 230 may be referred to as remaining sacrificial layer 230'. Put differently, operations at block 116 may remove the sacrificial layer 230 over the topmost surfaces and side surfaces of the first channel members 2081, second channel members 2082, and the third channel members 2083, to expose the gate dielectric layer 228 deposited thereover. Here, the topmost surfaces refer to the top surfaces of the topmost channel members in the first channel members 2081, second channel members 2082, and the third channel members 2083. As shown in FIG. 9, the remaining sacrificial layer 230' is disposed vertically between adjacent first channel members 2081, second channel members 2082, and third channel members 2083.

Figure 11:
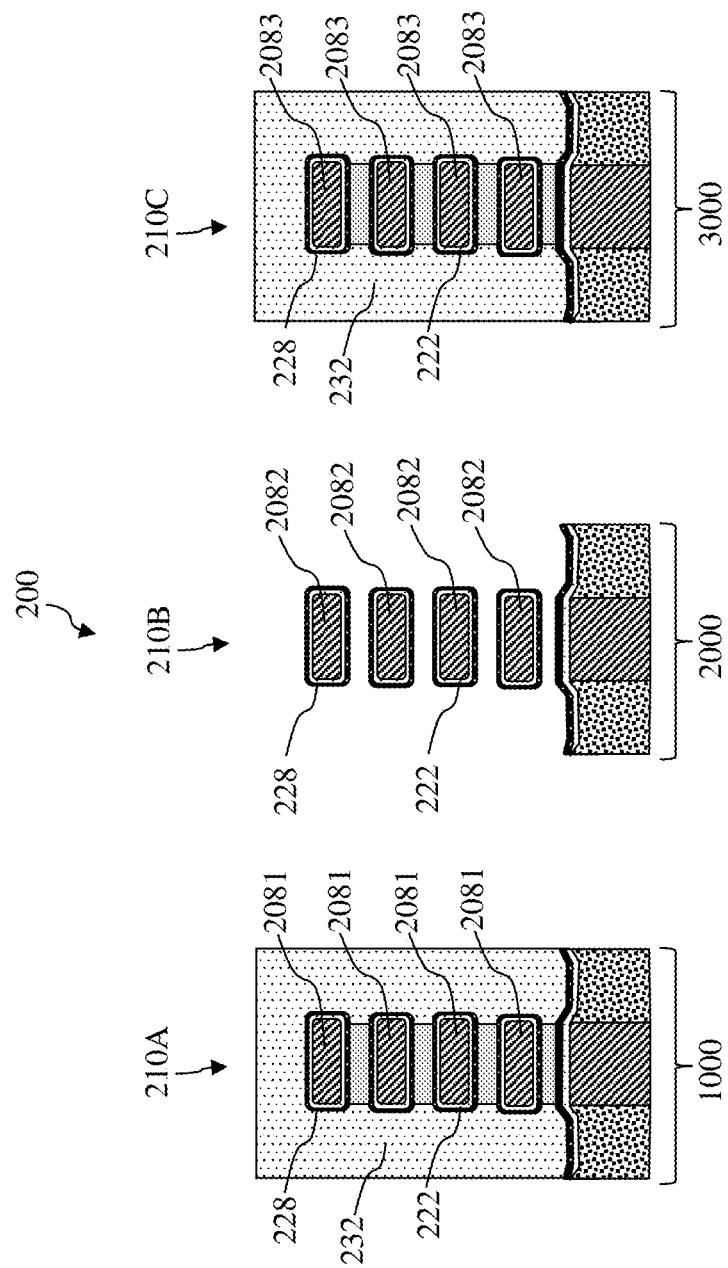
Figure 12:
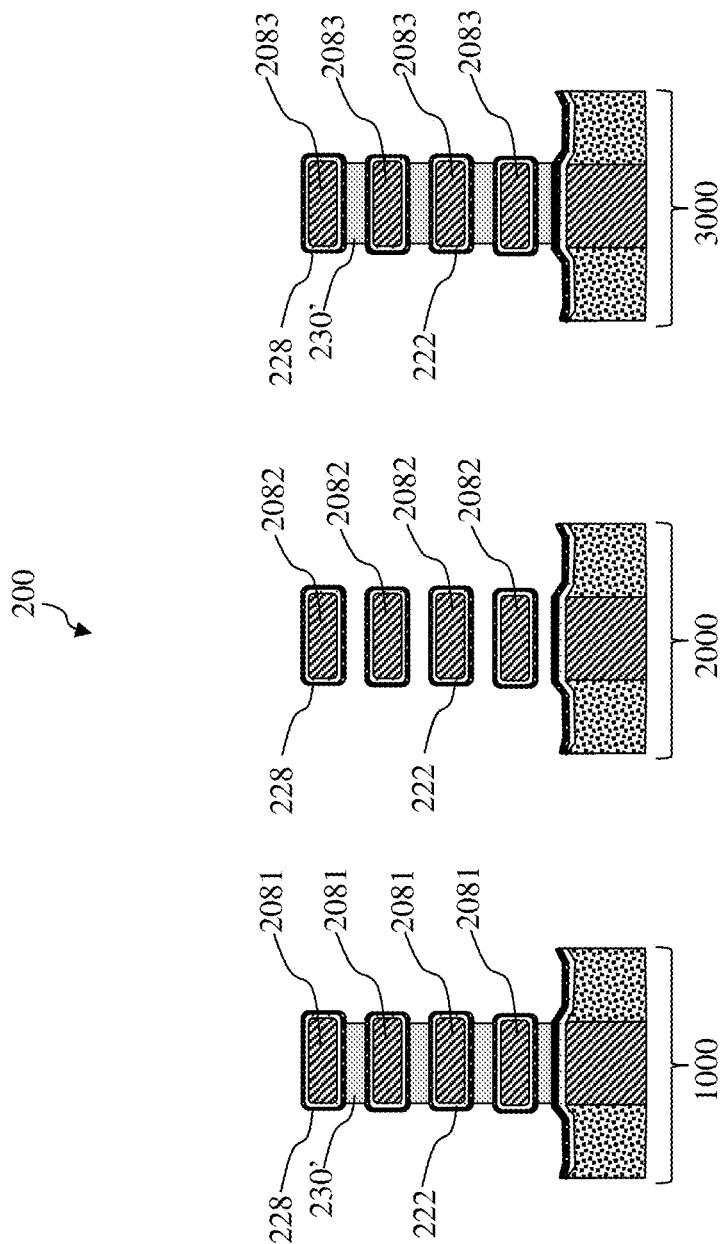

Referring to FIGS. 1, 10, 11, and 12, the method 100 includes a block 118 where the remaining sacrificial layer 230' in the second area 2000 is selectively removed. In some embodiments represented in FIG. 10, a patterned hard mask 232 may be formed such that the first area 1000 and the third area 3000 are covered by the patterned hard mask 232 and the second area 2000 is exposed. In an example process, a hard mask layer is first blanketly deposited over the workpiece 200, a bottom antireflective coating (BARC) layer is deposited over the deposited hard mask layer, and then a photoresist layer is deposited over the BARC layer. The photoresist layer is pre-baked, patterned by exposure to a patterned radiation passing through or reflected from a mask, post-baked, and developed in a developing process using a developer, to form a patterned photoresist layer. The patterned photoresist layer is used as an etch mask to pattern the BARC layer. Then the patterned BARC layer is used as an etch mask to pattern the hard mask layer so as to form the patterned hard mask 232. In some instances, the hard mask layer may be a single layer or a multilayer. Referring now to FIG. 11, the remaining sacrificial layer 230' is removed from the exposed second area 2000 while the first area 1000 and the third area 3000 remain masked by the patterned hard mask 232. Reference is now made to FIG. 12. The patterned hard mask 232 is removed using a suitable etching process.

Figure 13:
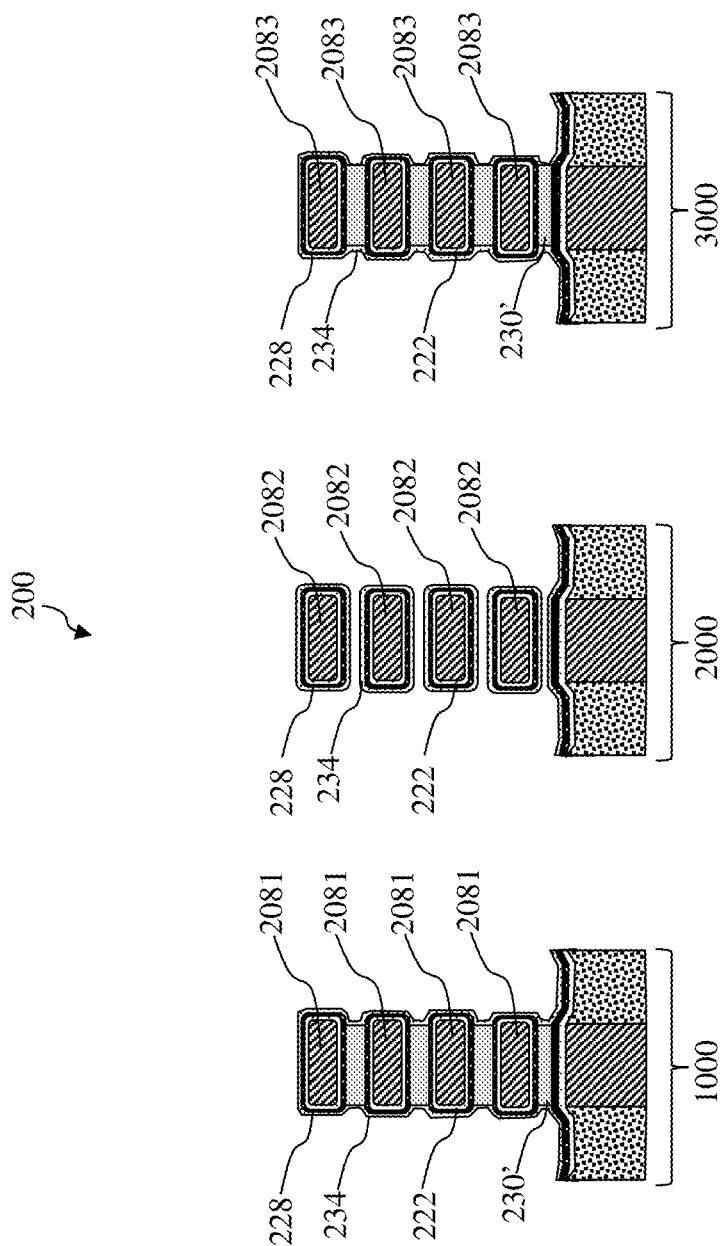
Figure 14:
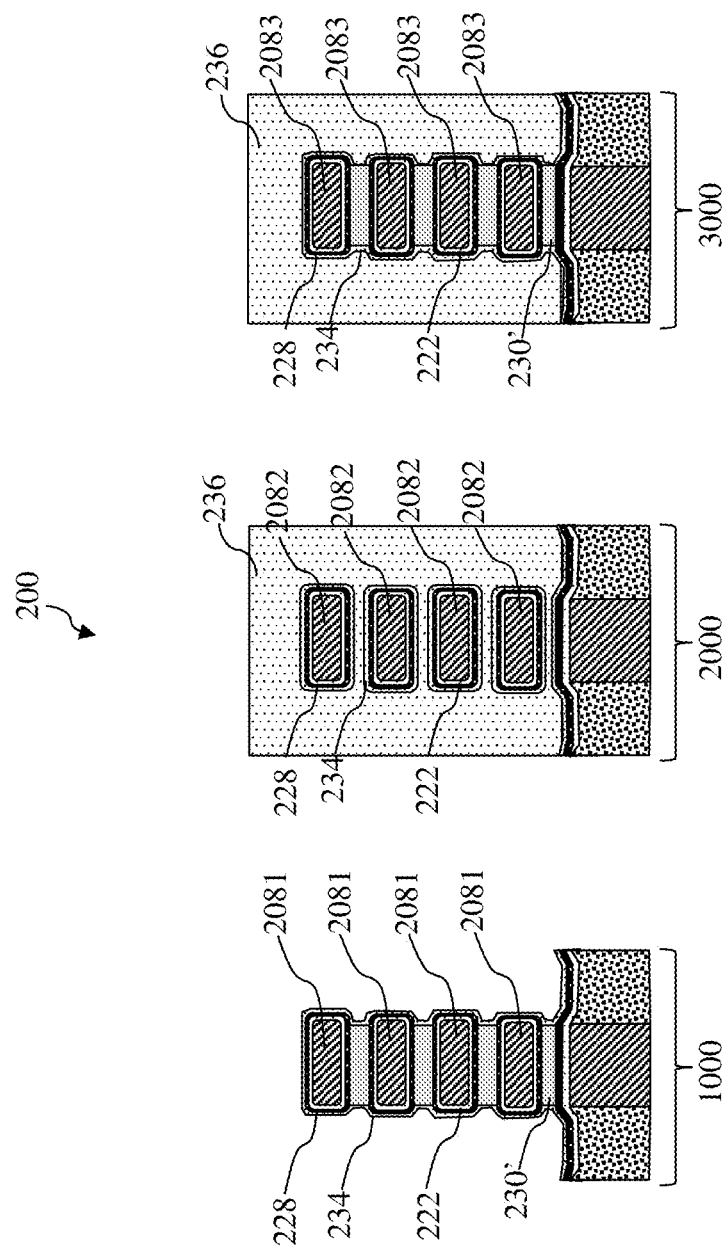

Referring to FIGS. 1 and 13, the method 100 includes a block 120 where a first work function layer 234 is deposited over the first channel members 2081, second channel members 2082, and third channel members 2083. In some embodiments, the first work function layer 234 may be a p-type work function layer and may include titanium nitride (TiN), titanium silicon nitride (TiSiN), tantalum nitride (TaN), tungsten carbonitride (WCN), molybdenum (Mo), or other suitable p-type work function material. The first work function layer 234 may be formed using ALD process. Because the remaining sacrificial layer 230' remains between adjacent first channel members 2081 and the third channel members 2083, the first work function layer 234 is prevented from being deposited around each of the first channel members 2081 and each of the third channel members 2083. Contrarily, the second area 2000 is substantially free of remaining sacrificial layer 230' and the first work function layer 234 is allowed to form in a way that it wraps around each of the second channel members 2082.

In conventional technology, an earlier deposited work function layer is allowed to be deposited between adjacent channel members. When the earlier deposited work function layer is to be removed, over-etching or enhanced etching may be needed to remove the work function material in the space between channel members. The over-etching or enhanced etching processes are likely to damage needed work function layers in adjacent transistors. If the earlier deposited work function layer is allowed to remain in the space between channel members, a subsequently deposited work function layer may be prevented from entering between adjacent channel members due to presence of an earlier deposited work function layer. The resulting device may have a threshold voltage greater than the necessary threshold voltage or different channel members in one transistor may have different threshold voltages. As will be seen in descriptions and illustrations that follow, the remaining sacrificial layer 230' functions to prevent hard-to-remove work function layers from being deposited between adjacent first channel members 2081 and adjacent third channel members 2083. As such, a subsequent etch process to release the first channel members 2081 or third channel members 2083 from one or more work function layers does not require over-etching to remove work function layer material between adjacent first channel members 2081 and adjacent third channel members 2083. By allowing the desired work function layer to wrap around the channel members without over-etching, processes of the present disclosure may produce low-threshold voltage transistors, improve threshold voltage uniformity, and improve yield.

Figure 15:
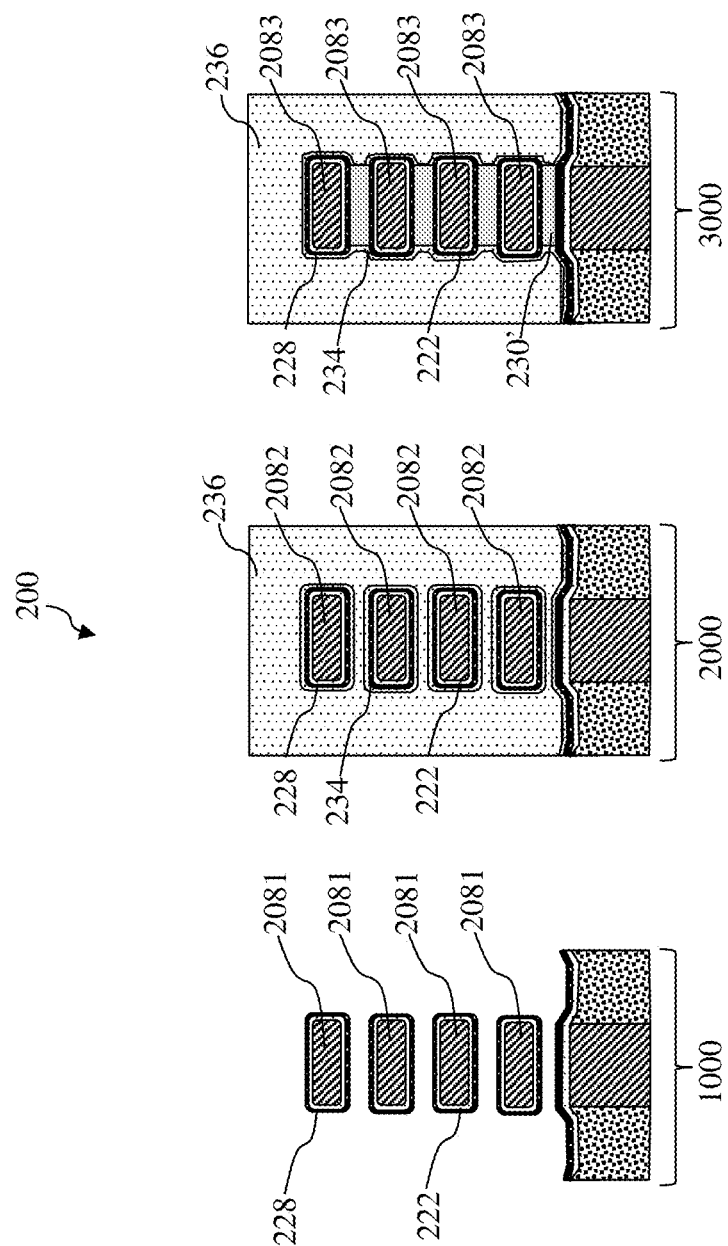
Figure 16:
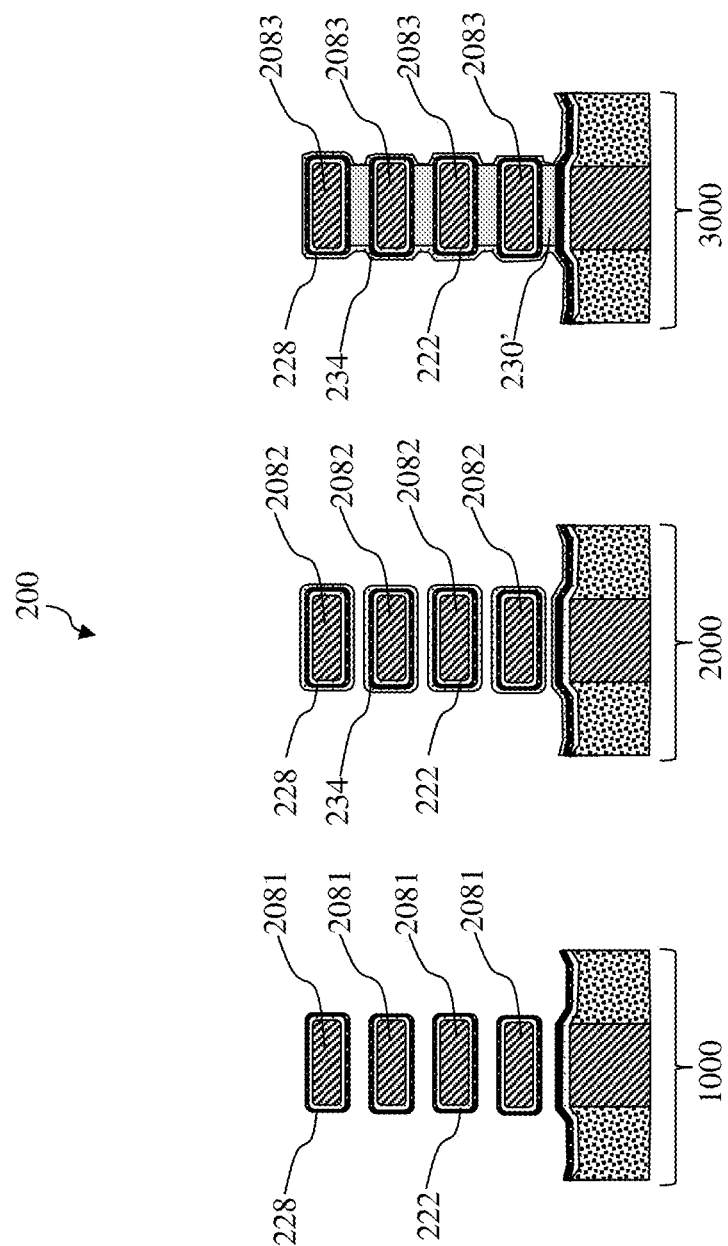

Referring to FIGS. 1, 14, 15, and 16, the method 100 includes a block 122 where the first work function layer 234 and the remaining sacrificial layer 230' over the first channel members 2081 are selectively removed. In some embodiments represented in FIG. 14, a patterned hard mask 236 may be formed such that the second area 2000 and the third area 3000 are covered by the patterned hard mask 236 and the first area 1000 is exposed. In an example process, a hard mask is first blanketly deposited over the workpiece 200, a bottom antireflective coating (BARC) layer is deposited over the deposited hard mask, and then a photoresist layer is deposited over the BARC layer. The photoresist layer is pre-baked, patterned by exposure to a patterned radiation passing through or reflected from a mask, post-baked, and developed in a developing process using a developer, to form a patterned photoresist layer. The patterned photoresist layer is used as an etch mask to pattern the BARC layer. Then the patterned BARC layer is used as an etch mask to pattern the hard mask layer. In some instances, the hard mask layer may be a single layer or a multilayer. Referring now to FIG. 15, the first work function layer 234 and the remaining sacrificial layer 230' are removed from the exposed first area 1000 while the second area 2000 and the third area 3000 remain masked by the patterned hard mask 236. In some implementations, the first work function layer 234 and the remaining sacrificial layer 230' may be removed using different etchants in two different etching processes such that each of the etching processes is geared toward the material to be removed. Reference is now made to FIG. 16. The patterned hard mask 236 is removed using a suitable etching process. In some instances, the first work function layer 234 has a thickness between about 0.5 nm and about 2 nm.

Figure 17:
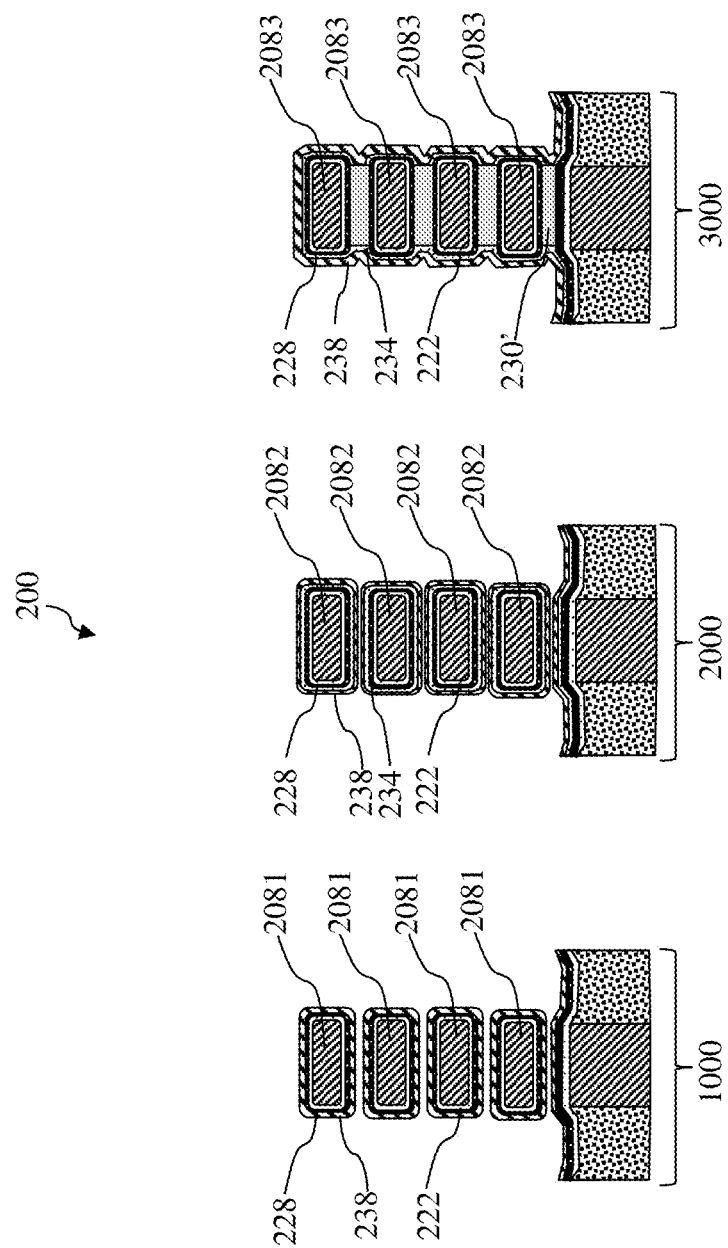
Figure 18:
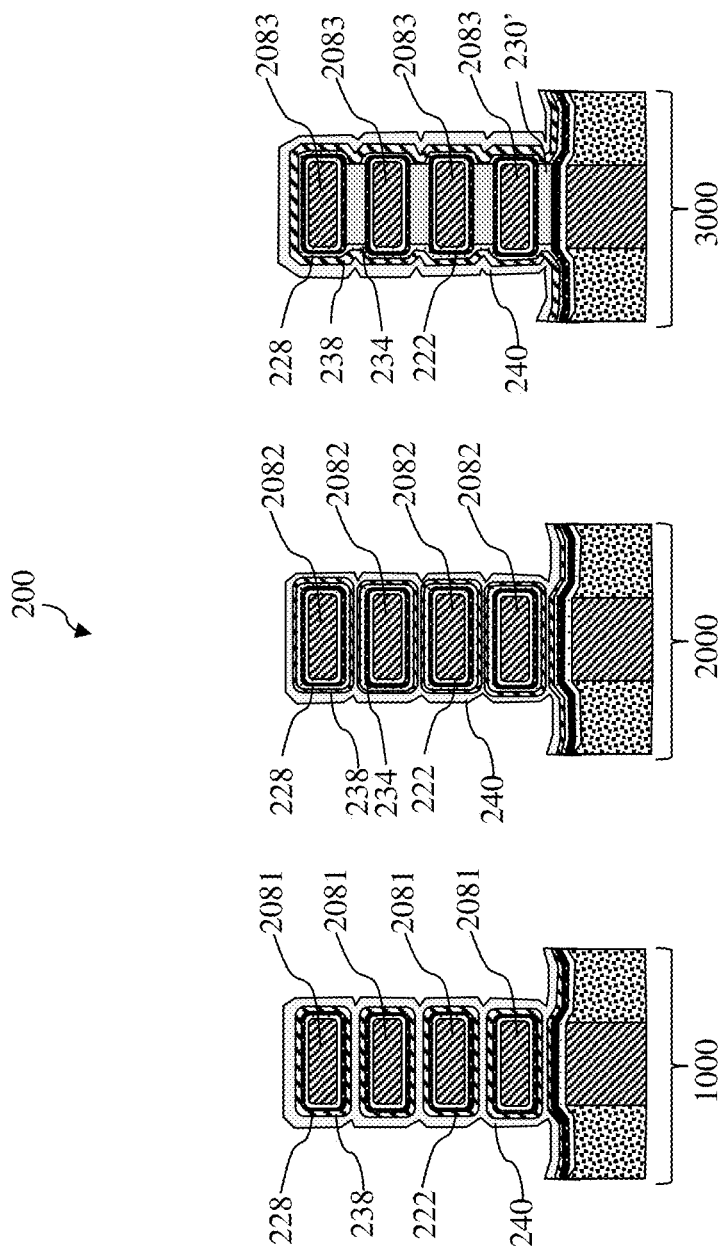
Figure 19:
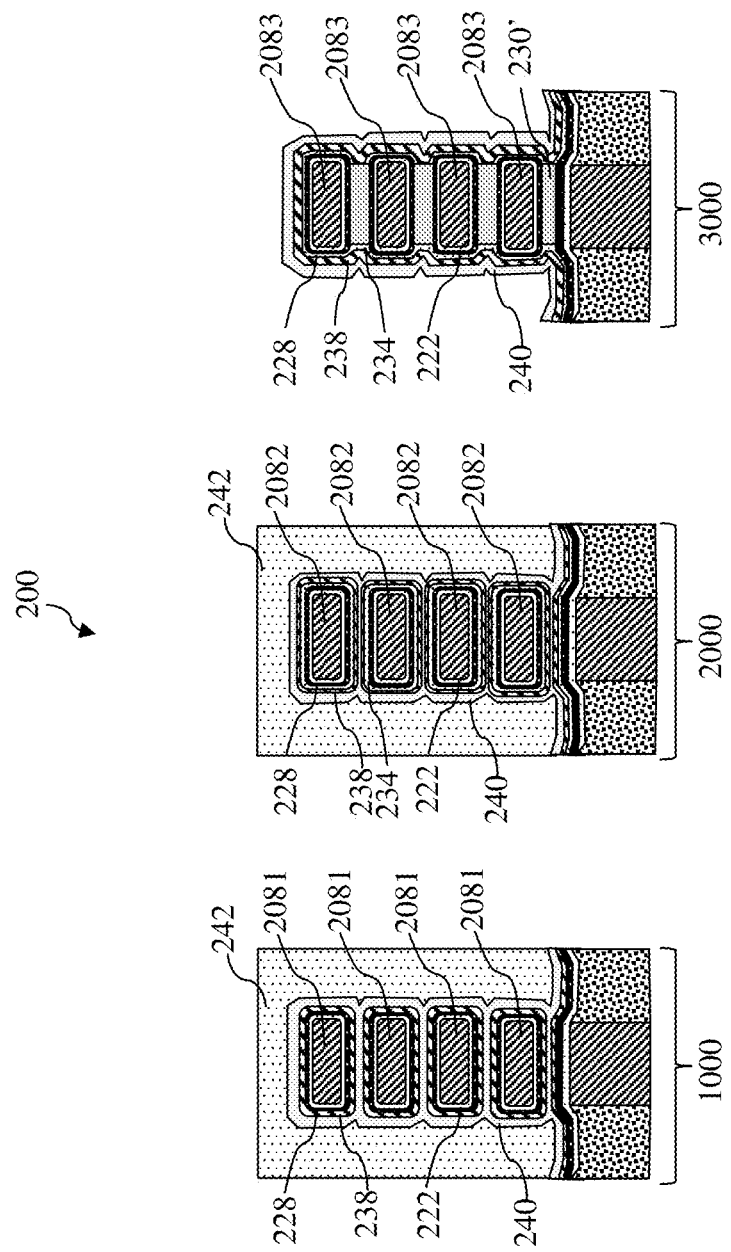

Referring to FIGS. 1 and 17, the method 100 includes a block 124 where a second work function layer 238 is deposited over the first channel members 2081, second channel members 2082, and third channel members 2083. The second work function layer 238 is different from the first work function layer 234. In some embodiments, the second work function layer 238 may be an n-type work function layer and may include aluminum (Al), titanium aluminum (TiAl), titanium aluminum carbide (TiAlC), tantalum aluminum carbide (TaAlC), tantalum aluminum silicide (TaSiAl), tantalum silicon carbide (TaSiC), tantalum silicide (TaSi), hafnium carbide (HfC), an aluminum containing layer, or other suitable n-type work function layer. The second work function layer 238 may be formed using ALD process. Because the remaining sacrificial layer 230' is removed from the first area 1000 and the second area 2000, the second work function layer 238 is allowed to be deposited in a fashion that the second work function layer 238 wraps around each of the first channel members 2081 and each of the second channel members 2082. With respect to the third area 3000, the second work function layer 238 is deposited over the first work function layer 234 and is not allowed to wrap around each of the third channel members 2083. In some instances, the second work function layer 238 includes a thickness between about 1 nm and about 3 nm. As shown in FIG. 18, the second work function layer 238 does not pinch off the space between adjacent first channel members 2081 and between adjacent second channel members 2082 such that a subsequent layer (e.g. the passivation layer 240 shown in FIG. 18) may be deposited between adjacent first channel members 2081 and between adjacent second channel members 2082.

Referring to FIGS. 1 and 18, method 100 includes a block 126 where a passivation layer 240 is deposited over the second work function layer 238. The operations at block 126 are optional and when performed, they are performed immediately after the deposition of the second work function layer 238 in the same process chamber without breaking vacuum. This is so because the passivation layer 240 functions to prevent oxidation of aluminum in the second work function layer 238 when the second work function layer 238 includes aluminum. When the second work function layer 238 does not include aluminum, operations at block 126 are omitted. In embodiments where the second work function layer 238 includes aluminum, operations at block 126 are performed. The passivation layer 240 may also be referred to as a protection layer 240. The material for the passivation layer 240 is selected such that the passivation layer 240 may either block oxygen diffusion or has a lower reduction potential than aluminum. When the material for the passivation layer 240 has a lower reduction potential than aluminum, it acts as an oxygen sink through preferential oxidation. In some embodiments, the passivation layer 240 may be formed of titanium nitride (TiN), titanium silicon nitride (TiSiN), silicon (Si), tantalum nitride (TaN), tungsten carbonitride (WCN), or other suitable material. In some instances, the passivation layer 240 may be formed to a thickness between about 0.5 nm and about 2 nm. In some other instances, the passivation layer 240 may be omitted. In embodiments where the passivation layer 240 is implemented, the passivation layer 240 is deposited to pinch off the space between adjacent first channel members 2081 and between adjacent second channel members 2082 such that a subsequent layer (e.g. the passivation layer 240 shown in FIG. 18) may not be deposited between adjacent first channel members 2081 and between adjacent second channel members 2082.

Figure 20:
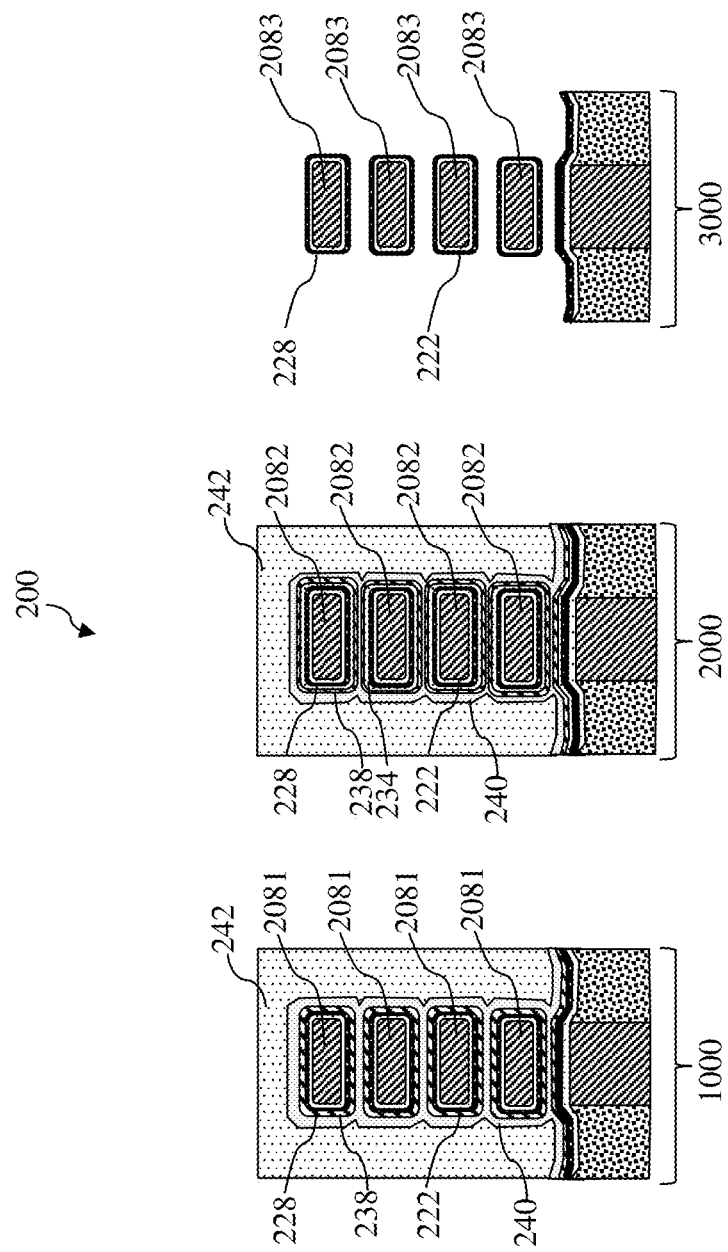
Figure 21:
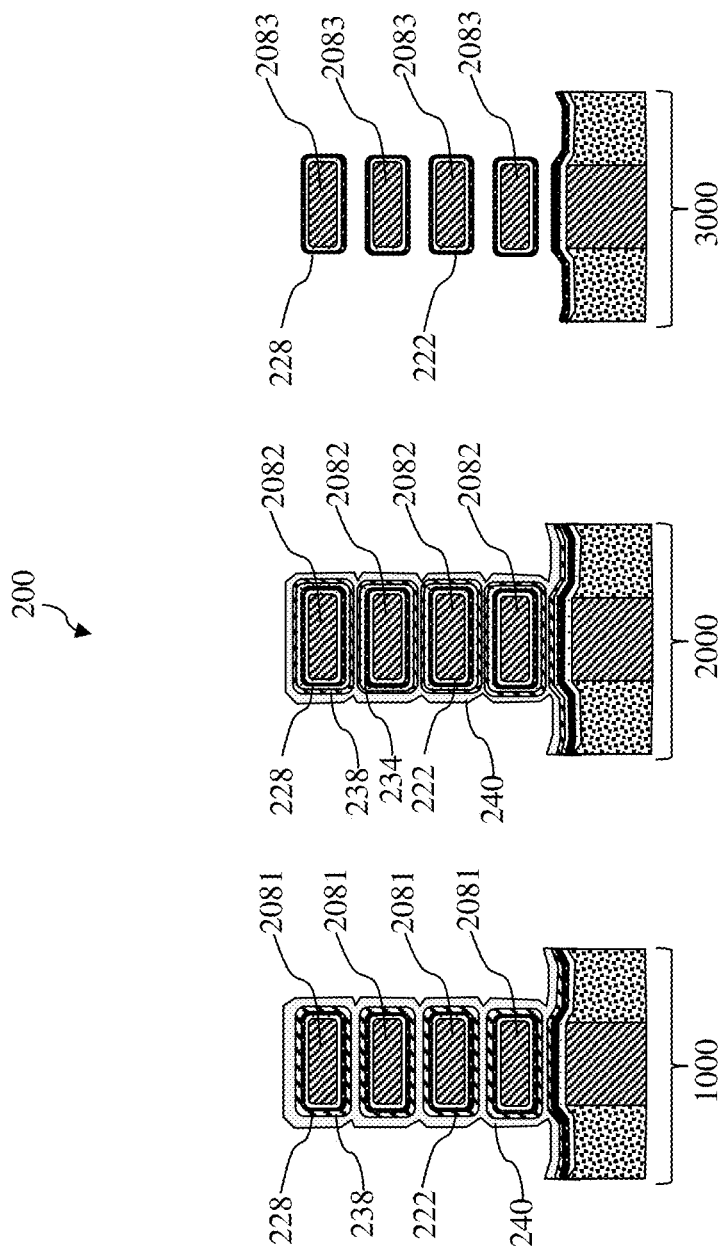

Referring to FIGS. 1, 19, 20, and 21, method 100 includes a block 128 where the second work function layer 238, the passivation layer 240, the first work function layer 234, and the remaining sacrificial layer 230' in the third area 3000 is selectively removed. In some embodiments represented in FIG. 19, a patterned hard mask 242 may be formed such that the first area 1000 and the second area 2000 are covered by the patterned hard mask 242 and the third area 3000 is exposed. In an example process, a hard mask is first blanketly deposited over the workpiece 200, a bottom antireflective coating (BARC) layer is deposited over the deposited hard mask, and then a photoresist layer is deposited over the BARC layer. The photoresist layer is pre-baked, patterned by exposure to a patterned radiation passing through or reflected from a mask, post-baked, and developed in a developing process using a developer, to form a patterned photoresist layer. The patterned photoresist layer is used as an etch mask to pattern the BARC layer. Then the patterned BARC layer is used as an etch mask to pattern the hard mask layer. In some instances, the hard mask layer may be a single layer or a multilayer. Referring now to FIG. 20, the passivation layer 240, the second work function layer 238, the first work function layer 234, and the remaining sacrificial layer 230' are removed from the exposed third area 3000 while the first area 1000 and the second area 2000 remain masked by the patterned hard mask 242. Reference is now made to FIG. 21. The patterned hard mask 242 is removed using a suitable etching process.

Figure 22:
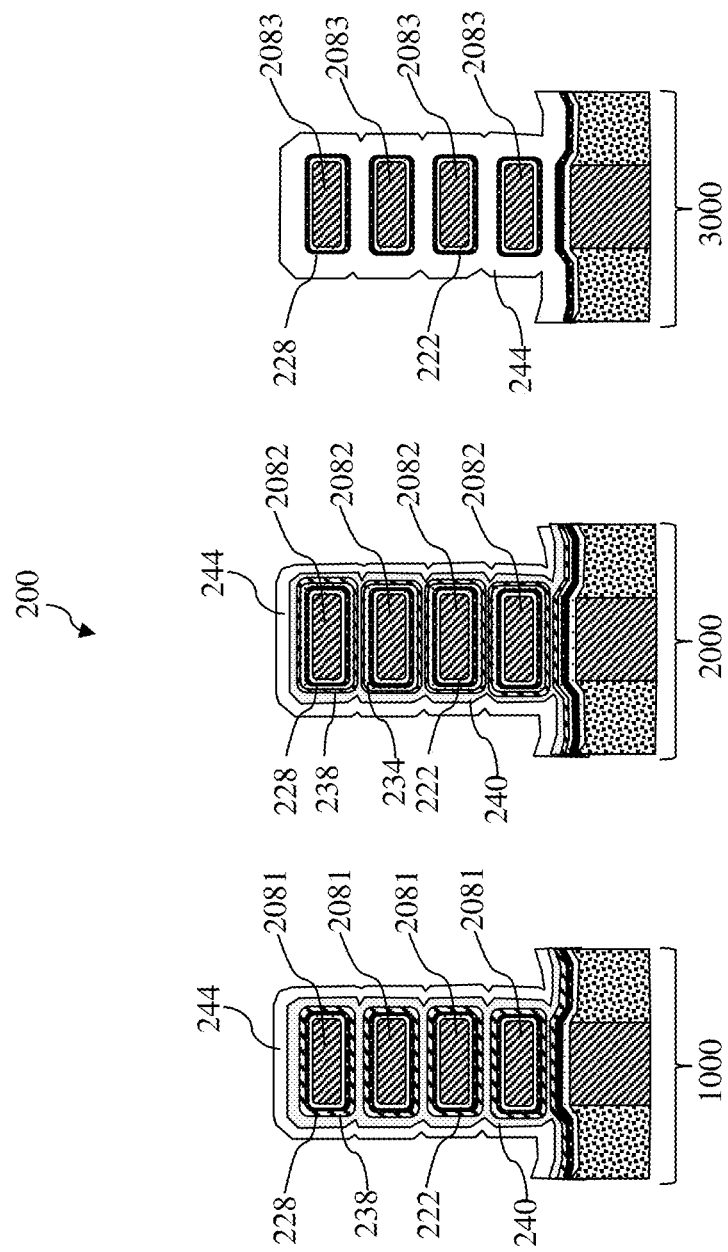

Referring to FIGS. 1 and 22, method 100 includes a block 130 where a glue layer 244 is deposited over the first channel members 2081, second channel members 2082, and third channel members 2083. In some embodiments, the glue layer 244 may be a p-type work function layer and may include titanium nitride (TiN), titanium silicon nitride (TiSiN), tantalum nitride (TaN), tungsten carbonitride (WCN), molybdenum (Mo), or other suitable p-type work function material. That is, a composition of the glue layer 244 may be identical to that of the first work function layer 234. In some implementations, the glue layer 244 may be formed by ALD to a thickness between about 2 nm and about 5 nm. In some instances, the glue layer 244 is deposited such that the space between adjacent third channel members 2083 is pinched off such that a subsequent layer may not be deposited between adjacent third channel members 2083.

Figure 23:
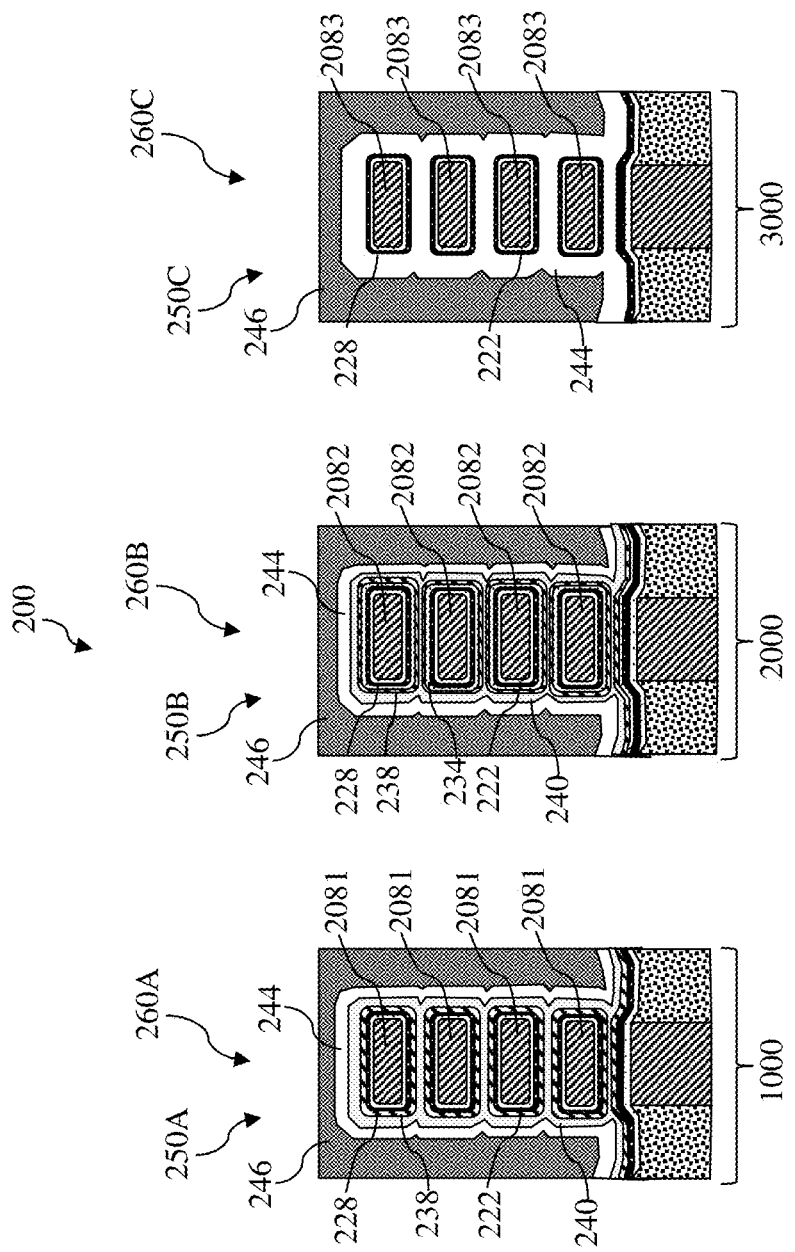

Referring to FIGS. 1 and 23, method 100 may include a block 132 where further processes are performed. Examples of such further processes may include deposition of a metal fill layer 246 over the channel regions (including the first channel region 1100, the second channel region 2100, and the third channel region 3100). The metal fill layer 246 may include tungsten (W) or cobalt (Co). Upon deposition of the metal fill layer 246, a first metal gate stack 250A is formed in the first area 1000, a second metal gate stack 250B is formed in the second area 2000, and a third metal gate stack 250C is formed in the third area 3000. The first metal gate stack 250A includes the interfacial layer 222, the gate dielectric layer 228, the second work function layer 238, the passivation layer 240, the glue layer 244, and the metal fill layer 246. The second metal gate stack 250B includes the interfacial layer 222, the gate dielectric layer 228, the first work function layer 234, the second work function layer 238, the passivation layer 240, the glue layer 244, and the metal fill layer 246. The third metal gate stack 250C includes the interfacial layer 222, the gate dielectric layer 228, the glue layer 244, and the metal fill layer 246. Examples of the further processes at block 132 may also include formation of an interlayer dielectric (ILD) layer, formation of the source/drain contacts through the ILD layer to couple to the source/drain features, and formation of gate connects to couple to the gate structures.

Upon conclusion of operations in method 100, a first GAA transistor 260A is formed in the first area 1000, a second GAA transistor 260B is formed in the second area 2000, and a third GAA transistor 260C is formed in the third area 3000. The first GAA transistor 260A is featured with the first metal gate stack 250A. The second GAA transistor 260B is featured with the second metal gate stack 250B. The third GAA transistor 260C is featured with the third metal gate stack 250C. As shown in FIG. 23, because the second work function layer 238 is an n-type work function layer that is formed directly on the gate dielectric layer 228 without an intervening p-type work function layer (i.e., the first work function layer 234), the first GAA transistor 260A may be an n-type GAA transistor with a threshold voltage lower than a would-be threshold voltage without an intervening p-type work function layer. The lack of an intervening p-type work function layer in the first area 1000 is made possible or at least facilitated by the use of the remaining sacrificial layer 230' (shown in FIG. 13), which prevents the first work function layer 234 (or too much first work function layer 234) from entering between adjacent first channel members 2081. Because the reduced amount or lack of the first work function layer 234 between adjacent first channel members 2081, no wet over-etching is required to remove the hard-to-remove first work function layer 234 from space between first channel members 2081.

Similarly, because the glue layer 244 is a p-type work function layer that is formed directly on the gate dielectric layer 228 without an adjacent n-type work function layer (i.e., the second work function layer 238), the third GAA transistor 260C may be a p-type GAA transistor with a threshold voltage lower than a would-be threshold voltage without an adjacent n-type work function layer. N-type work function layers may include high-diffusivity components that may diffuse into an adjacent p-type work function layer to undesirably shift the work function away from the valence band. For example, aluminum in an n-type work function layer may diffuse into a p-type work function layer of a p-type device, thereby moving the work function away from the valence band and undesirably increasing the threshold voltage. By removing the second work function layer 238 (i.e., an n-type work function layer) from the third area 3000, no high-diffusivity components from an n-type work function layer may be allowed to diffuse into the glue layer 244 (i.e., a p-type work function layer). The lack of an adjacent n-type work function layer in the third area 3000 is made possible or at least facilitated by the use of the remaining sacrificial layer 230' (shown in FIGS. 13 and 17), which prevents the first work function layer 234 (or too much first work function layer 234) and the second work function layer 238 (or too much second work function layer 238) from entering between adjacent third channel members 2083. Because the reduced amount or lack of the first work function layer 234 and the second work function layer 238 between adjacent third channel members 2083, no wet over-etching is required to remove the hard-to-remove first work function layer 234 and the second work function layer 238 from space between third channel members 2083.

In embodiments shown in FIG. 23, the second GAA transistor 260B includes a mid-level threshold voltage that falls between a n-type threshold voltage for the first GAA transistor 260A and the p-type threshold voltage for the third GAA transistor 260C. Different from the first metal gate stack 250A and the third metal gate stack 250C, the second metal gate stack 250B of the second GAA transistor 260B includes both the first work function layer 234 and the second work function layer 238.

In some embodiments not explicitly shown herein, one or more dipole layers may be optionally incorporated in the first metal gate stack 250A, the second metal gate stack 250B, and the third metal gate stack 250C to further diversify the threshold voltages in the semiconductor device 200. For example, depending on the electron affinity and oxygen atom density, dipole layers may either be an n-dipole layer or a p-dipole layer. Dipole layer(s) incorporated in each of the first metal gate stack 250A, the second metal gate stack 250B, and third metal gate stack 250C may further move the work function closer to the valence band or the conduction band, thereby shifting the resulting threshold voltages of the first GAA transistor 260A, the second GAA transistor 260B, and the third GAA transistor 260C. Example materials for an n-dipole layer include lanthanum oxide, magnesium oxide, or yttrium oxide. Example materials for a p-dipole layer aluminum oxide, titanium oxide, or niobium oxide. In some instances, dipole materials may be thermally introduced into the gate dielectric layer 228 without substantially increasing the thickness of the gate dielectric layer 228. By selectively treating the gate dielectric layer 228 in some of the first GAA transistors 260A but not that in the some other first GAA transistors 260A, the two first GAA transistors 260A may be further transformed into two sub-groups of first GAA transistors 260A with different threshold voltages. The same holds true for the second GAA transistors 260B and the third GAA transistors 260C. That is, by selective introduction of one dipole material, three types of GAA transistors with 3 threshold voltage levels may be made in six types of GAA transistors with 6 threshold voltage levels. It can therefore be seen that processes and semiconductor devices of the present disclosure open doors to formation of GAA transistors with diversified threshold voltages.

Based on the above discussions, the present disclosure offers advantages over conventional GAA transistors and processes for forming the same. It is understood, however, that other embodiments may offer additional advantages, and not all advantages are necessarily disclosed herein, and that no particular advantage is required for all embodiments. The present disclosure provides a semiconductor device formation process that utilize a sacrificial layer to prevent to-be-remove work function layers from entering the space between adjacent channel members. This arrangement allows satisfactory removal of the to-be-remove work function layers without over-etching that may cause damages to neighboring structures. The disclosed processes allow n-type work function layer to completely wrap around channel members in an n-type GAA transistor and substantially complete removal of n-type work function layer from around channel members in a p-type GAA transistors. As a result, n-type GAA transistors and p-type GAA transistors according to the present disclosure have lower threshold voltages.

The disclosure of the present disclosure provides embodiments of semiconductor devices and methods of forming the same. In one embodiment, a semiconductor device is provided. The semiconductor device includes a first gate-all-around (GAA) transistor, a second GAA transistor, and a third GAA transistor. The first GAA transistor includes a first plurality of channel members, an interfacial layer over the first plurality of channel members, a gate dielectric layer over the interfacial layer, a first work function layer over and in contact with the gate dielectric layer, and a glue layer over the first work function layer. The second GAA transistor includes a second plurality of channel members, the interfacial layer over the second plurality of channel members, the gate dielectric layer over the interfacial layer, and a second work function layer over and in contact with the gate dielectric layer, the first work function layer over and in contact with the second work function layer, and the glue layer over the first work function layer. The third GAA transistor includes a third plurality of channel members, the interfacial layer over the third plurality of channel members, the gate dielectric layer over the interfacial layer, and the glue layer over the gate dielectric layer.

In some embodiments, the first work function layer includes aluminum (Al), titanium aluminum (TiAl), titanium aluminum carbide (TiAlC), tantalum aluminum carbide (TaAlC), tantalum aluminum silicide (TaSiAl), tantalum silicon carbide (TaSiC), tantalum silicide (TaSi), or hafnium carbide (HfC) and the second work function layer includes titanium nitride (TiN), titanium silicon nitride (TiSiN), tantalum nitride (TaN), tungsten carbonitride (WCN), or molybdenum (Mo). In some implementations, wherein the glue layer includes titanium nitride (TiN), titanium silicon nitride (TiSiN), tantalum nitride (TaN), tungsten carbonitride (WCN), or molybdenum (Mo). In some instances, the first GAA transistor further includes a passivation layer disposed between the first work function layer and the glue layer, the second GAA transistor further includes the passivation layer disposed between the first work function layer and the glue layer, and the third GAA transistor is free of the passivation layer. In some embodiments, the first work function layer includes a thickness between 1 nm and about 3 nm, the second work function layer includes a thickness between about 0.5 nm and about 2 nm, the passivation layer includes a thickness between about 0.5 nm and about 2 nm, and the glue layer includes a thickness between about 2 nm and about 5 nm. In some implementations, the passivation layer includes titanium nitride (TiN), titanium silicon nitride (TiSiN), silicon (Si), tantalum nitride (TaN), or tungsten carbonitride (WCN). In some embodiments, each of the first GAA transistor, the second GAA transistor, and the third GAA transistor further includes a metal fill layer over the glue layer, and the metal fill layer includes tungsten (W) or cobalt (Co). In some implementations, the first work function layer is disposed completely around each of the plurality of the first plurality of channel members.

In another embodiment, a method is provided. The method includes providing a workpiece including a substrate, first vertically stacked channel members in a first area of the substrate, second vertically stacked channel members in a second area of the substrate, and third vertically stacked channel members in a third area of the substrate; depositing a gate dielectric layer over the first vertically stacked channel members, the second vertically stacked channel members, and the third vertically stacked channel members; depositing a sacrificial layer over the gate dielectric layer; etching the sacrificial layer such that a portion of the sacrificial layer remains disposed between adjacent ones of the first vertically stacked channel members, the second vertically stacked channel members, and the third vertically stacked channel members; selectively removing all of the sacrificial layer in the second area; depositing a first work function layer over the first vertically stacked channel members, the second vertically stacked channel members, and the third vertically stacked channel members; selectively removing the first work function layer and the sacrificial layer in the first area; depositing a second work function layer over the first vertically stacked channel members, the second vertically stacked channel members, and the third vertically stacked channel members, the second work function layer being different from the first work function layer; and depositing a passivation layer over the second work function layer.

In some embodiments, the providing of the workpiece includes forming a plurality of alternating semiconductor layers over the first area, the second area, and the third area of the substrate; patterning the plurality of alternating semiconductor layers to form a first active region in the first area, a second active region in the second area, and a third active region in the third area; and selectively removing the second plurality of second semiconductor layers to form the first vertically stack channel members in the first active region, and the second vertically stacked channel members in the second active region, and the third vertically stacked channel members in the third active region. The plurality of alternating semiconductor layers includes a first plurality of first semiconductor layers interleaved by a second plurality of second semiconductor layers. In some implementations, the etching of the sacrificial layer exposes the gate dielectric layer deposited over side surfaces of the first vertically stacked channel members, the second vertically stacked channel members, and the third vertically stacked channel members. In some instances, the sacrificial layer includes silicon oxide or silicon nitride. In some embodiments, the first work function layer includes aluminum (Al), titanium aluminum (TiAl), titanium aluminum carbide (TiAlC), tantalum aluminum carbide (TaAlC), tantalum aluminum silicide (TaSiAl), tantalum silicon carbide (TaSiC), tantalum silicide (TaSi), or hafnium carbide (HfC) and the second work function layer includes titanium nitride (TiN), titanium silicon nitride (TiSiN), tantalum nitride (TaN), tungsten carbonitride (WCN), or molybdenum (Mo). In some embodiments, the passivation layer includes titanium nitride (TiN), titanium silicon nitride (TiSiN), silicon (Si), tantalum nitride (TaN), or tungsten carbonitride (WCN). In some embodiments, the method may further include selectively removing the passivation layer, the first work function layer, the second work function layer, and the sacrificial layer in the third area; depositing a glue layer over the first vertically stacked channel members, the second vertically stacked channel members, and the third vertically stacked channel members; and depositing a metal fill layer over the glue layer. In some implementations, wherein the glue layer includes titanium nitride (TiN), titanium silicon nitride (TiSiN), tantalum nitride (TaN), tungsten carbonitride (WCN), or molybdenum (Mo), and the metal fill layer includes tungsten (W) or cobalt (Co).

In a further embodiment, a method is provided. The method includes providing a workpiece having a substrate, first vertically stacked channel members in a first area of the substrate, second vertically stacked channel members in a second area of the substrate, and third vertically stacked channel members in a third area of the substrate; depositing a gate dielectric layer over the first vertically stacked channel members, the second vertically stacked channel members, and the third vertically stacked channel members; depositing a sacrificial layer over the gate dielectric layer; partially and selectively etching the sacrificial layer such that a portion of the sacrificial layer is disposed between adjacent ones of the first vertically stacked channel members, the second vertically stacked channel members, and the third vertically stacked channel members; selectively removing all of the sacrificial layer in the second area; depositing a first work function layer over the first vertically stacked channel members, the second vertically stacked channel members, and the third vertically stacked channel members; selectively removing the first work function layer and the sacrificial layer in the first area; depositing a second work function layer over the first vertically stacked channel members, the second vertically stacked channel members, and the third vertically stacked channel members, the second work function layer being different from the first work function layer; depositing a passivation layer over the second work function layer; selectively removing the passivation layer, the first work function layer, the second work function layer, and the sacrificial layer in the third area; selectively removing the passivation layer, the first work function layer, the second work function layer, and the sacrificial layer in the third area; depositing a glue layer over the first vertically stacked channel members, the second vertically stacked channel members, and the third vertically stacked channel members; and depositing a metal fill layer over the glue layer. The first work function layer is different from the second work function layer and a composition of the first work function layer is substantially identical to a composition of the glue layer.

In some embodiments, the second work function layer includes aluminum (Al). In some implementations, the portion of the sacrificial layer disposed between adjacent ones of the third vertically stacked channel members prevents the first work function layer and second work function layer from being deposited between adjacent ones of the third vertically stacked channel members. In some instances, wherein the selectively removing all of the sacrificial layer in the second area ines use of an etchant having an etching selectivity to the sacrificial layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:
1. A semiconductor device, comprising:
 a first gate-all-around (GAA) transistor comprising:
  a first plurality of channel members,
  an interfacial layer over the first plurality of channel members,
  a gate dielectric layer over the interfacial layer,
  a first work function layer over and in contact with the gate dielectric layer, and
  a glue layer over the first work function layer;
 a second GAA transistor comprising:
  a second plurality of channel members,
  the interfacial layer over the second plurality of channel members,
  the gate dielectric layer over the interfacial layer,
  a second work function layer over and in contact with the gate dielectric layer,
  the first work function layer over and in contact with the second work function layer, and
  the glue layer over the first work function layer; and
 a third GAA transistor comprising:
  a third plurality of channel members,
  the interfacial layer over the third plurality of channel members,
  the gate dielectric layer over the interfacial layer, and
  the glue layer over the gate dielectric layer and wrapping around each of the third plurality of channel members.
2. The semiconductor device of claim 1,
 wherein the first work function layer comprises aluminum (Al), titanium aluminum (TiAl), titanium aluminum carbide (TiAlC), tantalum aluminum carbide (TaAlC), tantalum aluminum silicide (TaSiAl), tantalum silicon carbide (TaSiC), tantalum silicide (TaSi), or hafnium carbide (HfC),
wherein the second work function layer comprises titanium nitride (TiN), titanium silicon nitride (TiSiN), tantalum nitride (TaN), tungsten carbonitride (WCN), or molybdenum (Mo).

3. The semiconductor device of claim 2, wherein the glue layer comprises titanium nitride (TiN), titanium silicon nitride (TiSiN), tantalum nitride (TaN), tungsten carbonitride (WCN), or molybdenum (Mo).

4. The semiconductor device of claim 1,
wherein the first GAA transistor further comprises a passivation layer disposed between the first work function layer and the glue layer,
wherein the second GAA transistor further comprises the passivation layer disposed between the first work function layer and the glue layer,
wherein the third GAA transistor is free of the passivation layer.

5. The semiconductor device of claim 4,
wherein the first work function layer comprises a thickness between 1 nm and about 3 nm,
wherein the second work function layer comprises a thickness between about 0.5 nm and about 2 nm,
wherein the passivation layer comprises a thickness between about 0.5 nm and about 2 nm,
wherein the glue layer comprises a thickness between about 2 nm and about 5 nm.

6. The semiconductor device of claim 4, wherein the passivation layer comprises titanium nitride (TiN), titanium silicon nitride (TiSiN), silicon (Si), tantalum nitride (TaN), or tungsten carbonitride (WCN).

7. The semiconductor device of claim 1,
wherein each of the first GAA transistor, the second GAA transistor, and the third GAA transistor further comprises a metal fill layer over the glue layer,
wherein the metal fill layer comprises tungsten (W) or cobalt (Co).

8. The semiconductor device of claim 1, wherein the first work function layer is disposed completely around each of the plurality of the first plurality of channel members.

9. A semiconductor structure, comprising:
a first transistor comprising:
a first plurality of nanostructures,
an interfacial layer wrapping around each of the first plurality of nanostructures,
a gate dielectric layer over the interfacial layer and wrapping around the each of the first plurality of nanostructures,
a first work function layer over the gate dielectric layer and wrapping around the each of the first plurality of nanostructures, and
a glue layer over the first work function layer;
a second transistor comprising:
a second plurality of nanostructures,
the interfacial layer wrapping around each of the second plurality of nano structures,
the gate dielectric layer over the interfacial layer and wrapping around the each of the second plurality of nanostructures,
a second work function layer over the gate dielectric layer and wrapping around the each of the second plurality of nanostructures,
the first work function layer over the second work function layer and wrapping around the each of the second plurality of nanostructures, and
the glue layer over the first work function layer; and
a third transistor comprising:
a third plurality of nanostructures,
the interfacial layer wrapping around each of the third plurality of nano structures,
the gate dielectric layer over the interfacial layer and wrapping around the each of the third plurality of nanostructures, and
the glue layer over the gate dielectric layer and wrapping around the each of the third plurality of nanostructures.

10. The semiconductor structure of claim 9,
wherein the glue layer does not extend between adjacent ones of the first plurality of nanostructures,
wherein the glue layer does not extend between adjacent ones of the second plurality of nanostructures.

11. The semiconductor structure of claim 9,
wherein the first plurality of nanostructures are vertically arranged such that one of the first plurality of nanostructures is over another of the first plurality of nano structures,
wherein the second plurality of nanostructures are vertically arranged such that one of the second plurality of nanostructures is over another of the second plurality of nano structures,
wherein the third plurality of nanostructures are vertically arranged such that one of the third plurality of nanostructures is over another of the third plurality of nanostructures.

12. The semiconductor structure of claim 9,
wherein the first work function layer comprises aluminum (Al), titanium aluminum (TiAl), titanium aluminum carbide (TiAlC), tantalum aluminum carbide (TaAlC), tantalum aluminum silicide (TaSiAl), tantalum silicon carbide (TaSiC), tantalum silicide (TaSi), or hafnium carbide (HfC),
wherein the second work function layer comprises titanium nitride (TiN), titanium silicon nitride (TiSiN), tantalum nitride (TaN), tungsten carbonitride (WCN), or molybdenum (Mo).

13. The semiconductor structure of claim 9, wherein the glue layer comprises titanium nitride (TiN), titanium silicon nitride (TiSiN), tantalum nitride (TaN), tungsten carbonitride (WCN), or molybdenum (Mo).

14. The semiconductor structure of claim 9,
wherein the first transistor further comprises a passivation layer disposed between the first work function layer and the glue layer,
wherein the second transistor further comprises the passivation layer disposed between the first work function layer and the glue layer,
wherein the third transistor is free of the passivation layer.

15. The semiconductor structure of claim 14, wherein the passivation layer comprises titanium nitride (TiN), titanium silicon nitride (TiSiN), silicon (Si), tantalum nitride (TaN), or tungsten carbonitride (WCN).

16. The semiconductor structure of claim 14, wherein the passivation layer wraps around the each of the first plurality of nanostructures and the each of the second plurality of nanostructures.

17. A semiconductor structure, comprising:
a substrate having a first region, a second region and a third region;
a first plurality of nanostructures over the first region;
a second plurality of nanostructures over the second region;
a third plurality of nanostructures over the third region;

an interfacial layer wrapping around each of the first plurality of nanostructures, the second plurality of nanostructures and the third plurality of nanostructures;

a gate dielectric layer over the interfacial layer and wrapping around the each of the first plurality of nanostructures, the second plurality of nanostructures and the third plurality of nanostructures;

a first work function layer over the gate dielectric layer and wrapping around the each of the first plurality of nanostructures and the second plurality of nanostructures;

a second work function layer disposed between the gate dielectric layer and the first work function layer in the second region; and a glue layer over the first work function layer in the first region, the second region and the third region, wherein the glue layer wraps around each of the third plurality of nanostructures, wherein the glue layer does not extend between adjacent ones of the first plurality of nanostructures or adjacent ones of the second plurality of nanostructures.

18. The semiconductor structure of claim 17, wherein the first plurality of nanostructures are vertically arranged such that one of the first plurality of nanostructures is over another of the first plurality of nano structures, wherein the second plurality of nanostructures are vertically arranged such that one of the second plurality of nanostructures is over another of the second plurality of nano structures, wherein the third plurality of nanostructures are vertically arranged such that one of the third plurality of nanostructures is over another of the third plurality of nanostructures.

19. The semiconductor structure of claim 17, further comprising:

a passivation layer disposed between the first work function layer and the glue layer over the first region and the second region, wherein the third region is free of the passivation layer.

20. The semiconductor structure of claim 19, wherein the passivation layer comprises titanium nitride (TiN), titanium silicon nitride (TiSiN), silicon (Si), tantalum nitride (TaN), or tungsten carbonitride (WCN).

* * * * *